United States Patent
Mackin et al.

(10) Patent No.: US 10,871,466 B2
(45) Date of Patent: Dec. 22, 2020

(54) SENSOR SYSTEMS AND RELATED FABRICATION TECHNIQUES

(71) Applicant: Massachusetts Institute of Technology, Cambridge, MA (US)

(72) Inventors: Charles E. Mackin, Cambridge, MA (US); Tomás Apostol Palacios, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 182 days.

(21) Appl. No.: 15/773,247

(22) PCT Filed: Nov. 4, 2016

(86) PCT No.: PCT/US2016/060618
§ 371 (c)(1),
(2) Date: May 3, 2018

(87) PCT Pub. No.: WO2017/079620
PCT Pub. Date: May 11, 2017

(65) Prior Publication Data
US 2018/0321184 A1   Nov. 8, 2018

Related U.S. Application Data

(60) Provisional application No. 62/250,580, filed on Nov. 4, 2015.

(51) Int. Cl.
*G01N 27/414*   (2006.01)
*G03F 7/30*   (2006.01)
(Continued)

(52) U.S. Cl.
CPC ......... *G01N 27/4146* (2013.01); *G03F 7/095* (2013.01); *G03F 7/2022* (2013.01);
(Continued)

(58) Field of Classification Search
CPC ... G01N 27/4146; G03F 7/095; G03F 7/2022; G03F 7/30; H01L 29/1606; H01L 29/22;
(Continued)

(56) References Cited

U.S. PATENT DOCUMENTS 8,217,433 B1   7/2012 Fife
2012/0138458 A1   6/2012 Lee et al.

FOREIGN PATENT DOCUMENTS

| EP | 2581736 A1 | 4/2013 |
| JP | 2012073101 A | 4/2012 |
| KR | 101193986 B1 * | 10/2012 |

OTHER PUBLICATIONS

J. Zhou, et al. ("Flexible Transparent Junctionless TFTs With Oxygen-Tuned Indium-Zinc-Oxide Channels", IEEE Eelctron Device Letters, 34(7): p. 888-890, Jul. 2013.*
(Continued)

*Primary Examiner* — J. Christopher Ball
(74) *Attorney, Agent, or Firm* — Goodwin Procter LLP

(57) ABSTRACT

A sensor device including a substrate that is transparent and/or flexible, and a transparent sensor array disposed on the substrate. The transparent sensor array includes transparent sensor circuits and transparent interconnects electrically coupled to the transparent sensor circuits. Each of the transparent sensor circuits includes a transparent transistor. A transparent slide may include a transparent sensor circuit disposed on a transparent substrate. The slide may be prepared for observation of a specimen by placing the specimen in fluidic communication with the transparent sensor circuit. A flexible sensor device may include an array of transparent sensor circuits disposed on a flexible substrate. The flexible sensor device may be placed on the surface of an object to determine parameters at locations adjacent to the surface of the object. A method of fabricating
(Continued)

an integrated circuit may include using a multilayer etch mask of electron-beam resist and photoresist.

9 Claims, 23 Drawing Sheets

(51) Int. Cl.
```
H01L 29/16      (2006.01)
H01L 29/22      (2006.01)
H01L 21/02      (2006.01)
H01L 21/027     (2006.01)
H01L 29/24      (2006.01)
G03F 7/095      (2006.01)
G03F 7/20       (2006.01)
```
(52) U.S. Cl.
CPC ............ *G03F 7/30* (2013.01); *H01L 21/0274* (2013.01); *H01L 21/02527* (2013.01); *H01L 21/02554* (2013.01); *H01L 21/02568* (2013.01); *H01L 29/1606* (2013.01); *H01L 29/22* (2013.01); *H01L 29/24* (2013.01)

(58) Field of Classification Search
CPC ........... H01L 21/02568; H01L 21/0274; H01L 21/02527; H01L 21/02554; H01L 29/24
See application file for complete search history.

(56) References Cited

OTHER PUBLICATIONS

A. Balandin, "Low-Frequency 1/f Noise in Graphene Devices," Nat. Nanotechno., vol. 8, No. 8, pp. 549-555, Aug. 2013.
A. Reina et al., "Large Area, Few-Layer Graphene Films on Arbitrary Substrates by Chemical Vapor Deposition," Nano Lett., vol. 9, No. 1, pp. 30-35, 2009.
A. Suresh et al., "Fast all-transparent integrated circuits based on indium gallium zinc oxide thin-film transistors," IEEE Electron Device Letters 31:4, Apr. 2010, pp. 317-319.
A.H. Castro Neto et al., "The Electronic Properties of Graphene," Rev. Mod. Phys., vol. 81, No. 1, pp. 109-162, Jan. 2009.
A.K. Geim and K.S. Novoselov, "The Rise of Graphene," Nat. Mater., vol. 6, No. 3, pp. 183-191, Mar. 2007.
B.M. Giacchetti et al., "Graphene Chemical Sensors on Flexible Substrates," pp. 1-18.
B. Mailly-Giacchetti et al., "pH Sensing Properties of Graphene Solution-Gated Field-Effect Transistors," J.Appl. Phys., vol. 114, No. 8, p. 084505-084505-6, 2013.
C. Lee et al., "Measurement of the Elastic Properties and Intrinsic Strength of Monolayer Graphene," Science, vol. 321, pp. 385-388, Jul. 2008.
C. Mackin et al., "A Current-Voltage Model for Graphene Electrolyte-Gated Field-Effect Transistors," IEEE Trans. Electron Devices, vol. 61, No. 12, pp. 3971-3977, Dec. 2014.
C. Mackin et al., "Large-Scale Sensor Systems Based on Graphene Electrolyte-Gated Field-Effect Transistors", The Analyst, vol. 141, No. 9, Jan. 12, 2016. (pp. 2704-2711).
C. Neumann et al., "Raman spectroscopy as probe of nanometre-scale strain variations in graphene," Nat. Commun., vol. 6, p. 8429, May 2015.
C. Soldano et al., "Production, Properties and Potential of Graphene," Carbon N.Y., vol. 48, No. 8, pp. 2127-2150, Jul. 2010.
D. Chen et al., "Graphene-Based Materials in Electrochemistry," Chem. Soc. Rev., vol. 39, No. 8, pp. 3157-3180, Aug. 2010.
D.A.C. Brownson et al., "Graphene-Based Materials in Electrochemistry: Fundamental Concepts Through to Prominent Applications," Chem. Soc. Rev., vol. 41, pp. 6944-6976, 2012.
D.C. Elias et al., "Control of graphene's properties by reversible hydrogenation: evidence for graphene," Science, vol. 323, No. 5914, pp. 610-613, Jan. 2009.

D.Kuzum et al., "Transparent and flexible low noise graphene electrodes for simultaneous electrophysiology and neuroimaging," Nat. Commun. May 2014, p. 5259.
H. Ji et al., "Capacitance of Carbon-Based Electrical Double-Layer Capacitors," Nat. Commun., vol. 5, pp. 1-7, Jan. 2014.
H.J. Yoon et al., "A flexible biocompatible graphene sensor for real-time monitoring of PH and protein," 2011 6th IEEE Int. Conf. Nano/Micro Eng. Mol. Syst., pp. 1104-1107, Feb. 2011.
H.Wang et al., "Large-scale 2D electronics based on single-layer MoS2 grown by chemical vapor deposition," IEEE International Electron Device Meeting (IEDM) 2012 Tech. Digest, Dec. 2012, 4 pages.
I. Meric et al., "Current Saturation in Zero-Bandgap, Top-Gated Graphene Field-Effect Transistors," Nat. Nanotechnol., vol. 3, No. 11, pp. 654-659, Nov. 2008.
International Search Report and The Written Opinion of the International Searching Authority for International Application No. PCT/US2016/060618 dated Apr. 20, 2017 (23 pages).
J.-U. Park et al., "Synthesis of Monolithic Graphene-Graphite Integrated Electronics," Nat. Mater., vol. 11, No. 2, pp. 120-125, Feb. 2012.
J. Viventi et al., Flexible, foldable, actively multiplexed, high-density electrode array for mapping brain activity in vivo., Nat. Neurosci. 14:12, Dec. 2011, pp. 1599-1605.
J. Xia et al. "Measurement of the Quantum Capacitance of Graphene," Nat. Nanotechnol., vol. 4, No. 8, pp. 505-509, Aug. 2009.
J.D. Buron et al., "Graphene mobility mapping," Sci. Rep., vol. 5, p. 12305, 2015.
K.S. Kim et al., "Large-Scale Pattern Growth of Graphene Films for Stretchable Transparent Electrodes," Nature, vol. 457, No. 7230, pp. 706-710, Feb. 2009.
K.W. Clark et al., "Spatially Resolved Mapping of Electrical Conductivity across Individual Domain (Grain) Boundaries in Graphene," ACS Nano, vol. 7. No. 9., pp. 7956-7966, 2013.
L.H. Hess et al., "High-Transconductance Graphene Solution-Gated Field Effect Transistors," Appl. Phys. Lett., vol. 99, No. 3, p. 033503, 2011.
L.H. Less et al., "Graphene Transistors for Bioelectronics," Proc. IEEE, vol. 101, No. 7, pp. 1780-1792, 2013.
L.H. Less et al.,"Graphene Transistor Arrays for Recording Action Potentials from Electrogenic Cells," Adv. Mater., vol. 23, No. 43, pp. 5045-5049, Nov. 2011.
M. Dankerl et al., "Graphene Solution-Gated Field-Effect Transistor Array for Sensing Applications," Adv. Funct. Mater., vol. 20, No. 18, pp. 3117-3124, Sep. 2010.
M.Zhou et al., "Electrochemical Sensing and Biosensing Platform Based on Chemically Reduced Graphene Oxide," Anal. Chem., vol. 81, No. 14, pp. 5603-5613, Jul. 2009.
N. Petrone et al., "Chemical Vapor Deposition-Derived Graphene with Electrical Performance of Exfoliated Graphene," Nano Lett., vol. 12, No. 6, pp. 2751-2756, Jun. 2012.
N.Lei et al., "High-resolution extracellular stimulation of dispersed hippocampal culture with high-density CMOS multielectrode array based on non-Faradaic electrodes," J. Neural Eng. vol. 8, 2011, 7 pages.
N.Schweirz et al., "Reversed Anionic Hofmeister Series: The interplay of Surface Charge and Surface Polarity," Langmuir ACS J. surfaces colloids, vol. 26, No. 10, pp. 7370-7379, May 2010.
S.-J Han et al., "High-Frequency Graphene Voltage Amplifer," Nano Lett., vol. 11, No. 9, pp. 3690-3693, Sep. 2011.
S. Adam et al., "A Self-Consistent Theory for Graphene Transport," Proc. Natl. Acad. Sci. U.S.A., vol. 104, No. 47, pp. 18392-18397, Nov. 2007.
S. Bae et al., "Roll-to-roll production of 30-inch graphene films for transparent electrodes.," Nat. Nanotechnol., vol. 5, No. 8, pp. 574-578, Aug. 2010.
S. Birner, "Modeling of Semiconductor Nanostructures and Semiconductor—Electrolyte Interfaces," 2011. 126 pages.
S. Das et al. "All two-dimensional, flexible, transparent, and thinnest thin film transistor," Nano Letters 14:5, May 14, 2014, pp. 2861-2866.

(56) References Cited

OTHER PUBLICATIONS

S. Vishniakou et al., "Tactile Feedback Display with Spatial and Temporal Resolutions", Scientific Reports, vol. 3, Aug. 28, 2013, 7 pages.

S.Vishniakou et al., Supplementary Materials for "Tactile feedback display with spatial and temporal resolutions," Aug. 28, 2013, available at http://www.nature.com/article-assets/npg/srep/2013/130828/srep02521/extref/srep02521-s1.pdf (accessed Mar. 27, 2018), 12 pages.

X. Li et al., "Large-Area Synthesis of High-Quality and Uniform Graphene Films on Copper Foils," Science, vol. 324, No. 5932, pp. 1312-1314, Jun. 2009.

X. Wang et al., "Transparent, conductive graphene electrodes for dye-sensitized solar cells," Nano Lett., vol. 8, No. 13, pp. 323-327, Mar. 2008.

Y. Fujisaki et al., "Transparent nanopaper-based flexible organic thin-film transistor array," Advanced Functional Materials 24:12, Nov. 19, 2013, pp. 1657-1663.

Y. Shao et al., "Graphene Based Electrochemical Sensors and Biosensors: A Review," Electroanalysis, vol. 22, No. 10, pp. 1027-1036, May 2010.

Y. Zhu et al., "Graphene and Graphene Oxide: Synthesis, Properties, and Applications," Adv. Mater., vol. 22, No. 35., pp. 3906-3924, Sep. 2010.

Y.H. Kwak et al., "Flexible glucose sensor using CVD-grown graphene-based field effect transistor.," Biosens. Bioelectron., vol. 37, No. 1, pp. 82-87, 2012.

\* cited by examiner

SENSOR SYSTEMS AND RELATED FABRICATION TECHNIQUES

CROSS-REFERENCE TO RELATED APPLICATIONS

This application is the national stage of International (PCT) Patent Application No. PCT/US2016/060618, filed on Nov. 4, 2016, which claims priority to and the benefit of U.S. Provisional Patent Application No. 62/250,580, entitled "Potentially Low-Cost and Transparent Sensor Array Systems for Cellular Monitoring and Smart Skin Applications" and filed on Nov. 4, 2015, each of which is hereby incorporated by reference herein in its entirety.

STATEMENT REGARDING FEDERALLY SPONSORED RESEARCH OR DEVELOPMENT

This invention was made with government support under Graduate Research Fellowship awarded by the National Science Foundation (NSF). The government has certain rights in the invention.

BACKGROUND

Arrayed sensor technologies generally make use of wire sharing along with some form of integrated semiconductor material to access rows, columns, or individual sensors. These sensor arrays are generally application-specific integrated circuits using traditional semiconductor processing technology such as silicon-CMOS and are therefore generally complex, physically rigid, and expensive. Because silicon is opaque, these types of sensor arrays are also incompatible with the compound microscopes and fluorescence imaging often employed in the life sciences. On the positive side, however, these types of sensor arrays generally use on the order of N+M wires to access N×M sensors.

The foregoing discussion is intended to assist the reader in understanding the present disclosure, is not admitted to be prior art, and does not in any way limit the scope of any of the claims.

SUMMARY

According to an aspect of the present disclosure, a sensory system is provided. The sensor system includes a sensor device. The sensor device includes: a substrate that is a transparent substrate or a flexible polymer substrate; and a transparent sensor array disposed on the substrate, the transparent sensor array including a plurality of transparent sensor circuits and a plurality of transparent interconnects electrically coupled to the plurality of transparent sensor circuits. Each of the transparent sensor circuits includes a respective transparent transistor having (i) a transparent drain electrically coupled to at least one of the transparent interconnects, (ii) a transparent source electrically coupled to at least one of the transparent interconnects, and (iii) a transparent channel region electrically coupled to the source and the drain. At least one of the transparent interconnects is coupled to a plurality of the transparent drains or to a plurality of the transparent sources.

In some embodiments, the transparent sensor array includes M*N of the transparent sensor circuits arranged in M rows and N columns, and the plurality of transparent interconnects includes M row selection interconnects and N column readout interconnects. In some embodiments, (i) each of the row selection interconnects corresponds to a respective row of N transparent sensor circuits and is coupled to the drains of the N transparent sensor circuits in the respective row, and (ii) each of the column readout interconnects corresponds to a respective column of M transparent sensor circuits and is coupled to the sources of the M transparent sensor circuits in the respective column.

In some embodiments, the system further includes a readout device. The readout device includes: a row selection circuit including M row selection switches configured to communicatively couple, respectively, to the M row selection interconnects of the sensor device; and an amplifier circuit including N amplifiers configured to communicatively couple, respectively, to the N column readout interconnects of the sensor device. The readout device is not integrated on the substrate of the sensor device.

In some embodiments, each of the N amplifiers includes a voltage amplifier. In some embodiments, each of the N amplifiers includes a transimpedance amplifier.

In some embodiments, the readout device further includes a control circuit configured to: selectively activate a selected one of the row selection switches corresponding to a selected one of the rows of transparent sensor circuits; and provide a first signal to the drains of the transparent sensor circuits in the selected row via the selected row selection switch and the corresponding row selection interconnect. In some embodiments, each of the N transparent sensor circuits in the selected row is configured to provide a respective second signal to the corresponding amplifier, wherein each second signal is based, at least in part, on the first signal and on a state of the channel region of the respective transparent sensor circuit. In some embodiments, each of the N transparent sensor circuits in the selected row is configured as a common source amplifier.

In some embodiments, the substrate is the transparent substrate, and the transparent substrate includes borosilicate glass. In some embodiments, the substrate is the flexible polymer substrate, and the flexible polymer substrate includes or consists essentially of a material such as polyethylene terephthalate, polyimide, and/or polyether ether ketone. In some embodiments, the transparent interconnects, transparent drains, and transparent sources each include indium tin oxide (ITO). In some embodiments, each of the transparent channel regions includes or consists essentially of a material such as graphene, a transition metal dichalcogenide, and/or a metal oxide.

In some embodiments of the invention, the techniques described herein may be used to produce an economical glass slide with a fully transparent embedded sensor array capable of monitoring cell cultures either chemically or electrically. In some embodiments, a two component sensor system separates the sensor array from the sensor selection and signal manipulation circuitry, and operates in conjunction with data processing apparatus (e.g., a data acquisition system, microcontroller development board, field programmable gate array, etc.).

According to another aspect of the present disclosure, a sensing method is provided. The method includes preparing a transparent slide for observation of a specimen by placing the specimen in fluidic communication with a transparent sensor circuit, wherein the transparent slide includes the transparent sensor circuit disposed on a transparent substrate.

In some embodiments, (i) the transparent sensor circuit includes a transparent transistor having a transparent channel region, and (ii) placing the specimen in fluidic communication with the transparent sensor circuit includes placing the specimen in fluidic communication with the transparent channel region. In some embodiments, the transparent channel region is in physical contact with the specimen. In some embodiments, the slide includes a transparent sensor array disposed on the transparent substrate, the transparent sensor array includes a plurality of transparent sensor circuits and a plurality of transparent interconnects electrically coupled to the plurality of transparent sensor circuits, the plurality of transparent sensor circuits includes the sensor circuit, and each of the transparent sensor circuits includes a respective transparent transistor having (i) a transparent drain electrically coupled to at least one of the transparent interconnects, (ii) a transparent source electrically coupled to at least one of the transparent interconnects, and (iii) a transparent channel region electrically coupled to the source and the drain. In some embodiments, the transparent substrate includes polystyrene or glass such as borosilicate glass or silica glass.

In some embodiments, the method further includes: detecting an electrical signal from the transparent sensor circuit, and determining at least one attribute of the specimen based at least in part on the electrical signal. In some embodiments, the determined attribute of the specimen is a chemical attribute of the specimen or an electrical attribute of the specimen. In some embodiments, the specimen includes a cell culture medium. In some embodiments, the determined attribute of the specimen is a nutrient level of the cell culture medium or a pH of the cell culture medium. In some embodiments, the cell culture medium includes electrogenic cells and a drug candidate.

In some embodiments, the method further includes obtaining an image of the specimen on the transparent slide by using a microscope. In some embodiments, the specimen includes a fluorescent material, and the microscope is a fluorescence microscope. In some embodiments, preparing the transparent slide further includes adding a stain to the specimen.

According to another aspect of the present disclosure, another sensing method is provided. The method includes: placing a sensor device on a surface of an object, wherein (i) the sensor device includes a sensor array disposed on a flexible polymer substrate, (ii) the sensor array includes a plurality of transparent sensor circuits, (iii) a surface of the flexible polymer substrate is in contact with and conforms to at least a portion of the surface of the object, and (iv) each of the transparent sensor circuits is disposed at a respective location adjacent to the surface of the object; detecting electrical signals from the transparent sensor circuits; and determining parameters at the respective locations adjacent to the surface of the object based on the electrical signals.

In some embodiments, the portion of the surface of the object is non-planar. In some embodiments, the object is a space shuttle, an aircraft, or a body portion of a person. In some embodiments, the sensor array is transparent. In some embodiments, the parameters are temperatures and/or electrolyte levels.

In some embodiments, the sensor device further includes a plurality of interconnects electrically coupled to the plurality of transparent sensor circuits, and each of the transparent sensor circuits includes a respective transparent transistor having (i) a transparent drain electrically coupled to at least one of the interconnects, (ii) a transparent source electrically coupled to at least one of the interconnects, and (iii) a transparent channel region electrically coupled to the source and the drain. In some embodiments, the interconnects are transparent.

According to another aspect of the present disclosure, a method for fabricating an integrated circuit is provided. The method includes steps of: forming a layer of a first material on a substrate; depositing an electron-beam resist layer of a multilayer etch mask on the first material layer; depositing a photoresist layer of the multilayer etch mask on the electron-beam resist layer, wherein the electron-beam resist layer and the photoresist layer of the multilayer etch mask include different materials; defining a pattern in the photoresist layer, thereby uncovering portions of the electron-beam resist layer; and developing the uncovered portions of the electron-beam resist layer of the multilayer etch mask, thereby defining the pattern in the electron-beam resist layer.

In some embodiments, the method further includes exposing the electron-beam resist layer to high energy radiation. In some embodiments, exposing the electron-beam resist layer to the high-energy radiation includes flood exposing the electron-beam resist layer to the high energy radiation before the deposition of the photoresist layer. In some embodiments, the electron-beam resist layer is exposed to the high energy radiation after the definition of the pattern in the photoresist layer. In some embodiments, the high energy radiation includes radiation of deep ultraviolet light or electron beam radiation. In some embodiments, flood exposing the electron-beam resist layer to high energy radiation includes exposing the electron-beam resist layer to the high energy radiation without first defining a pattern in the electron-beam resist layer.

In some embodiments, the method further includes etching at least a portion of the first material exposed by the patterned multilayer etch mask. In some embodiments, portions of the etched first material underlying the patterned multilayer etch mask include channel regions of transparent transistors.

In some embodiments, the method further includes removing the patterned multilayer etch mask. In some embodiments, removing the patterned multilayer etch mask includes immersing the etch mask in a solvent. In some embodiments, the solvent is selected from the group consisting of acetone and N-methyl-2-pyrrolidone (NMP). In some embodiments, the method further includes, after removing the patterned multilayer etch mask: forming a layer of a second material on the integrated circuit; and defining a pattern in the layer of second material, thereby exposing at least portions of the channel regions of the transparent transistors. In some embodiments, the second material includes an electrical insulator.

In some embodiments, the first material is transparent. In some embodiments, the first material includes a material such as graphene, a transition metal dichalcogenide, and/or a metal oxide.

The foregoing Summary, including the description of advantages of some embodiments of the invention, is intended to assist the reader in understanding the present disclosure and does not in any way limit the scope of any of the claims.

BRIEF DESCRIPTION OF THE DRAWINGS

Certain advantages of some embodiments may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

DETAILED DESCRIPTION

In accordance with some embodiments of the invention, a transparent sensor device is provided. As used herein, unless otherwise noted, "transparent" structures have high transmittance for visible and ultraviolet light having wavelengths between approximately 300 nm and 750 nm. The transmittance of a transparent structure for visible light may be between 0.50 and 0.95, between 0.60 and 0.80, between 0.70 and 0.95, between 0.80 and 0.95, between 0.90 and 0.94, or approximately 0.92. Some examples of transparent structures include colorless borosilicate glass coverslips and quartz class coverslips suitable for use as covers for microscope slides.

In accordance with some embodiments of the invention, a locally transparent sensor device is provided. As used herein, unless otherwise noted, a device is "locally transparent" if a substantial proportion (e.g., more than 50%, more than 80%, more than 85%, more than 90%, or more than 95%) of the device is transparent. For purposes of calculating the local transparency of a device, the device is conceptually divided into small regions of substantially the same volume (e.g., regions having a width of 10-20 nm, a length of 10-20 nm, and a depth equal to the depth of the device), and the transparency of each region is assessed individually. The proportion of the device that is transparent is the proportion of regions that are transparent. Thus, in a locally transparent device, visible light that is incident on certain, relatively small portions of a surface of the device encounter non-transparent regions of the device, and visible light that is incident on other portions of the surface encounter transparent regions of the device.

Figure 1A:
FIGS. 1A, 1B, 1C, 1D, 1E, 1F, 1G, 1H, and 1I are a series of schematic cross-sectional views of a structure illustrating a process for fabricating a sensor device in accordance with certain embodiments of the invention.

Referring to FIG. 1A, in accordance with embodiments of the invention, a substrate 110 may be rigid and compatible with subsequent processing steps for fabricating a sensor device, such as the processing steps illustrated in FIGS. 1A-1J and described below. In some embodiments, the substrate 110 is transparent. For example, the substrate 110 may include or consist essentially of transparent glass (e.g., borosilicate glass such as PYREX, silica glass, etc.).

In some embodiments, the substrate 110 is flexible. As discussed below, a flexible substrate may be made of polymer, e.g., polyethylene terephthalate (PET), polyetherimide, polyimide, polyether ether ketone, polystyrene, polydimethylsiloxane (PDMS), etc. In embodiments in which the substrate 110 is flexible, one or more sacrificial layers may be present under the substrate 110 during subsequent processing steps, such as the processing steps illustrated in FIGS. 1A-1J. For example, a top sacrificial layer may be under the substrate 110, and a bottom sacrificial layer may be under the top sacrificial layer. The bottom sacrificial layer may be rigid and compatible with the subsequent processing steps. After a suitable processing step (e.g., the processing step illustrated in FIG. 10, the sacrificial layers may be removed (e.g., dissolved), leaving the flexible substrate 110 and the device fabricated thereon. In some embodiments, the top sacrificial layer is made of a metallic material (e.g., Ni, Al, Ti, Au, Cu, etc.), an oxide, and/or a nitride, and has a thickness in the range of tens of nanometers to several microns. In some embodiments, the bottom (rigid) sacrificial layer is made of a material such as silicon, glass, or borosilicate, and has a thickness in the range of a few hundred microns to several millimeters. The sacrificial layers may be removed by chemical-mechanical polishing or dissolved using a suitable etchant, for example, copper etchant (e.g., ferric chloride).

In some embodiments, the substrate 110 is a sacrificial substrate, such that a sensor device may be fabricated on the sacrificial substrate and then transferred to another substrate, which may be flexible and/or transparent. For the sacrificial substrate 110, any suitable substrate material may be used, provided that the substrate material can withstand subsequent processing steps. For example, the sacrificial substrate may include silicon (Si), silicon dioxide ($SiO_2$), a No. 2 coverslip with 0.2 mm thickness, a thin layer of metal (e.g., nickel or copper) covering a thicker, mechanically stable layer of material (e.g., silicon or glass), etc.

A bottom gate layer 120 is deposited over the substrate 110. The bottom gate layer 120 may be conductive and transparent. In some embodiments, the bottom gate layer 120 is made of a material that is a member of the family of transparent conductive oxides (TCOs), for example, indium tin oxide (ITO), aluminum-doped zinc oxide (AZO), etc. The bottom gate layer 120 may be deposited using a suitable deposition method (e.g., electron beam deposition or sputter deposition) and may have a thickness, for example, in the range of several nanometers to several microns (e.g., 150 nm).

Figure 1B:

Referring to FIG. 1B, a gate dielectric layer 130 is deposited on the bottom gate layer 120. The gate dielectric layer 130 may be an electrical insulator and compatible with subsequent processing steps for fabricating a sensor device, as illustrated in FIGS. 1C-1J and described below. In some embodiments, the gate dielectric layer 130 is transparent. For example, the gate dielectric layer 130 may be made of transparent aluminum oxide ($Al_2O_3$), which may be deposited using a suitable deposition method, e.g., atomic layer deposition (ALD). The transparent gate dielectric layer 130 has a thickness, for example, in the range of several nm to hundreds of nm (e.g., 25 nm). Alternatively, the gate dielectric layer 130 may be a thin layer of silicon dioxide ($SiO_2$) or hafnium dioxide ($HfO_2$), which may be deposited using a suitable deposition method (e.g., ALD or chemical vapor deposition (CVD)) and may have a thickness, for example, in the range of several nanometers to hundreds of nanometers (e.g., 25 nm). In some embodiments, a thickness of the gate dielectric layer 130 is selected such that the gate dielectric layer 130 is as thin as possible to facilitate reliable control of a gated device at low gate voltages (e.g., gate voltages of a few volts or less), yet thick enough to avoid introducing adverse performance issues such as excess gate oxide leakage currents and reliability issues such as gate oxide breakdown.

Figure 1C:
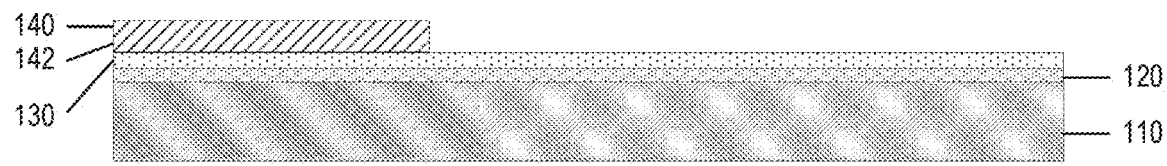

Referring to FIG. 1C, a first interconnect layer 140 is deposited on the gate dielectric layer 130. The first interconnect layer 140 may be an electrical conductor and compatible with subsequent processing steps for fabricating a sensor device, as illustrated in FIGS. 1D-1J and described below. In some embodiments, the first interconnect layer 140 is transparent. For example, the first interconnect layer may be formed from a material that is a member of the family of TCOs, for example, ITO, AZO, etc. It may be formed and patterned by electron beam ("ebeam") evaporation and lift-off photolithography, or by blanket deposition (e.g., sputtering), photolithography, and etching. The ITO-based first interconnect layer 140 may have a thickness, for example, of tens of nanometers to hundreds of nanometers or even several microns (e.g., 300 nm). Alternatively, the first interconnect layer 140 may be metallic (e.g., copper (Cu), titanium (Ti), gold (Au), etc.) or may be a film including layers of two or more metals (e.g., a layer of titanium and a layer of gold), which may be formed and patterned using suitable techniques (e.g., the same techniques described above with reference to forming and patterning ITO), and may have a thickness, for example, of 160 nm (e.g., 10 nm for the Ti layer and 150 nm for the Au layer). In general, thicker interconnects are selected to reduce the RC delay of the interconnects, whereas thinner interconnects are selected to increase the interconnect transmittance and to decrease surface roughness of the device.

Figure 6:
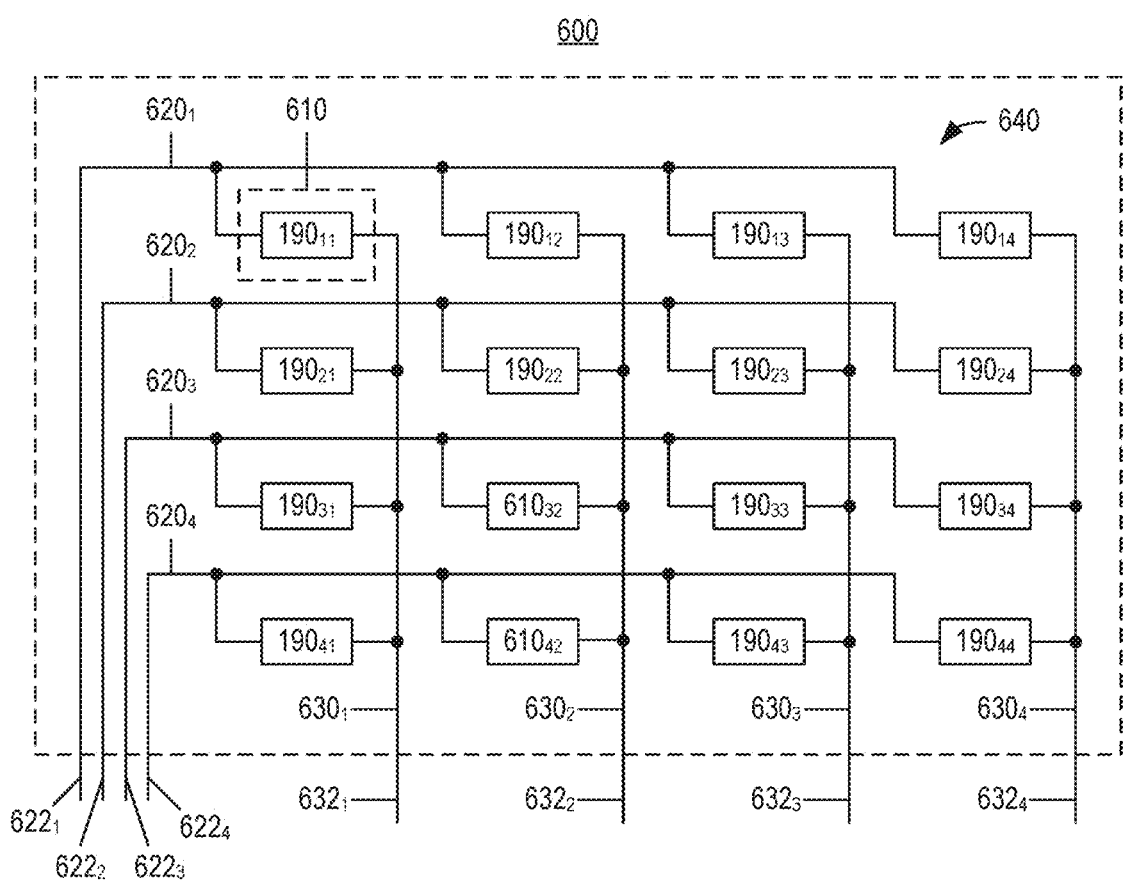
FIG. 6 is a schematic view of a sensor device in accordance with an embodiment of the invention.

The first interconnect layer 140 may be patterned to define one or more structures, for example, a source region 142 of a device (e.g., a field effect transistor (FET)) to be formed in subsequent processing steps (see, e.g., the FET 190 in FIGS. 1I and 1J) and/or column readout interconnects for columns of devices in an array of devices (see, e.g., the column readout interconnects 630 for the columns of FETs in the array 640 of FETs in FIG. 6). After patterning of the first interconnect layer 140, portions of the gate dielectric layer 130 are exposed in regions where portions of the first interconnect layer 140 are removed.

Figure 1D:
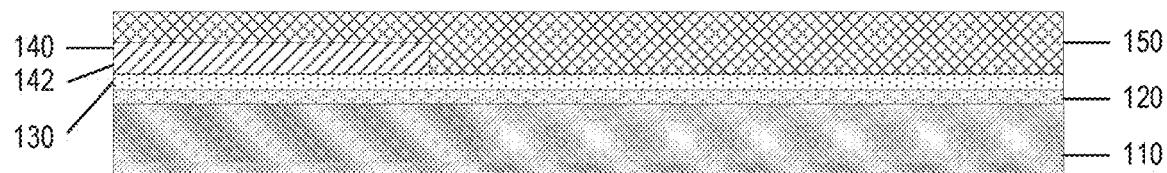

Referring to FIG. 1D, an interlayer dielectric (ILD) 150 is deposited on the first interconnect layer 140 and the exposed portions of the bottom gate layer 130. The ILD 150 may be an electrical insulator and compatible with subsequent processing steps for fabricating a sensor device, as illustrated in FIGS. 1E-1J and described below. In some embodiments, the ILD 150 is transparent. For example, the ILD 150 may be made of transparent $Al_2O_3$, which may be deposited using a suitable deposition method, e.g., ALD. The transparent ILD 150 has a thickness, for example, of 25 nm. Alternatively, the ILD may be formed using other suitable dielectric materials (e.g., $SiO_2$) and/or deposition methods (e.g., CVD), and may have any suitable thickness (e.g., tens of nanometers to hundreds of nanometers or even several microns). In general, a thicker ILD is selected to reduce parasitic capacitance and leakage current, and to reduce the risk of oxide breakdown, whereas a thinner ILD is selected to reduce surface roughness of the device and to enhance the flatness of the device.

Figure 1E:
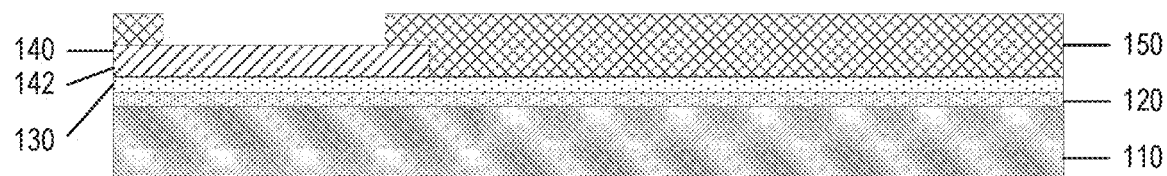

Referring to FIG. 1E, a photolithographic mask is defined and the ILD 150 is dry etched to expose portions of the first interconnect layer 140. The etchant may be a $BCl_3$ plasma or any other etchant suitable for removing portions of the ILD 150 with good etch selectivity to the underlying first interconnect layer 140. In some embodiments, the exposed portions of the first interconnect layer 140 include portions of a source region 142, on which a channel material may be deposited in a subsequent processing step (see, e.g., the channel material 170 in FIGS. 1G-1J). In some embodiments, vias may be formed in a subsequent processing step to connect at least some of the exposed portions of the first interconnect layer 140 to one or more other subsequently formed interconnect layers.

Figure 1F:
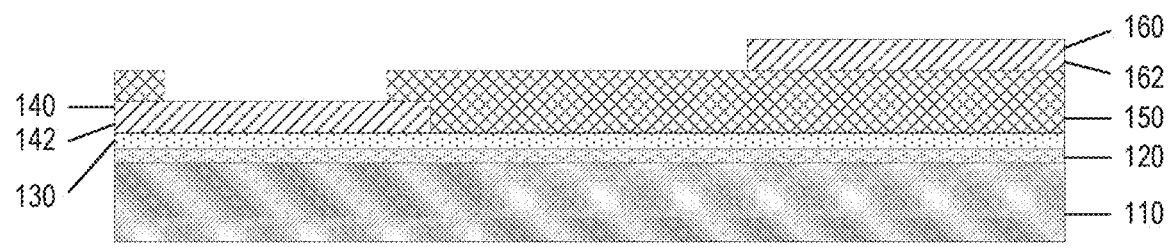

Referring to FIG. 1F, a second interconnect layer 160 is deposited over the ILD 150 and the exposed portions of the first interconnect layer 140. The second interconnect layer 160 may be an electrical conductor. In some embodiments, the second interconnect layer 160 is transparent. For example, the second interconnect layer may be formed from a material that is a member of the family of TCOs, for example, ITO, AZO, etc. It may be formed and patterned by ebeam evaporation and lift-off photolithography, or by blanket deposition (e.g., sputtering), photolithography, and etching. In the latter case, a timed etch process may be used to remove portions of the second interconnect layer 160 without removing underlying portions of the first interconnect layer 140. The ITO-based second interconnect layer 160 may have a thickness, for example, of tens of nanometers to hundreds of nanometers or even several microns (e.g., 300 nm). Alternatively, the second interconnect layer 160 may be metallic or may be a film including layers of two or more metals (e.g., a layer of titanium and a layer of gold), which may be formed and patterned using suitable techniques (e.g., the same techniques described above with reference to forming and patterning ITO), and may have a thickness, for example, of 160 nm (e.g., 10 nm for the Ti layer and 150 nm for the Au layer). In general, a thickness of the interconnect layer is selected taking into consideration that thicker interconnects reduce the RC delay of the interconnects, whereas thinner interconnects increase the interconnect transmittance and decrease surface roughness of the device.

Figure 5A:
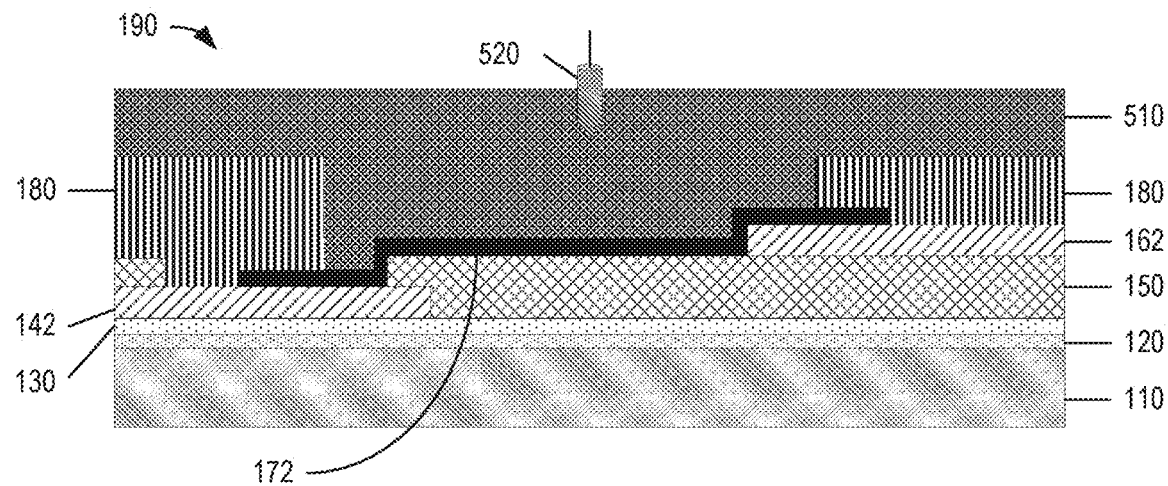
FIG. 5A is a schematic cross-sectional view of a sensor device with a reference gate electrode in accordance with an embodiment of the invention.
Figure 5B:
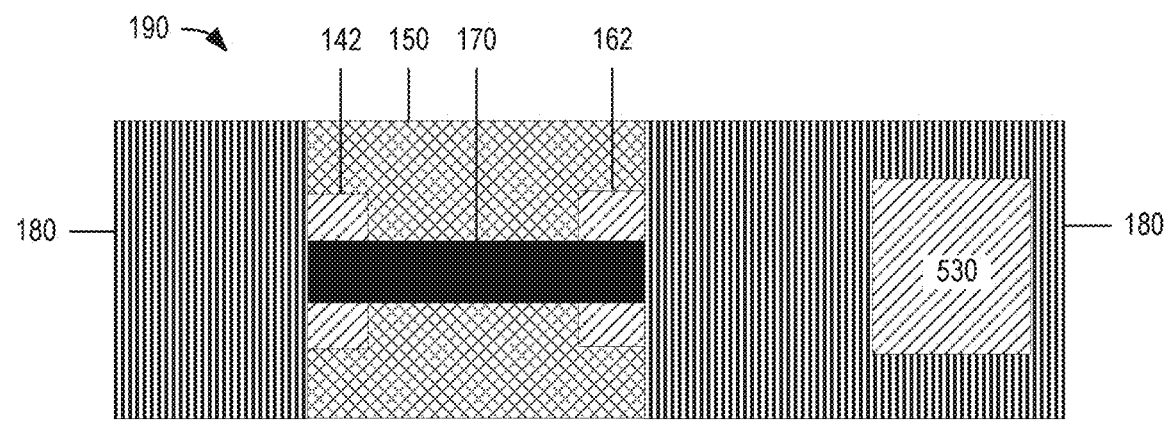
FIG. 5B is a schematic top view of a sensor device with a top gate electrode in accordance with an embodiment of the invention.

The second interconnect layer 160 may be patterned to define one or more structures, for example, a drain region 162 of a device (e.g., a field effect transistor (FET)), row selection interconnects for rows of devices in an array of devices (see, e.g., the row selection interconnects 620 for the rows of FETs in the array 640 of FETs in FIG. 6), and/or a top gate electrode for a device or array of devices (see e.g., the top gate electrode 530 of the FET 190 in FIG. 5B). After patterning of the second interconnect layer 160, portions of the ILD 150 are exposed in regions where portions of the second interconnect layer 160 are removed, and portions of the first interconnect layer 140 are exposed in regions where portions of both the second interconnect layer 160 and the ILD 150 are removed.

Figure 1G:
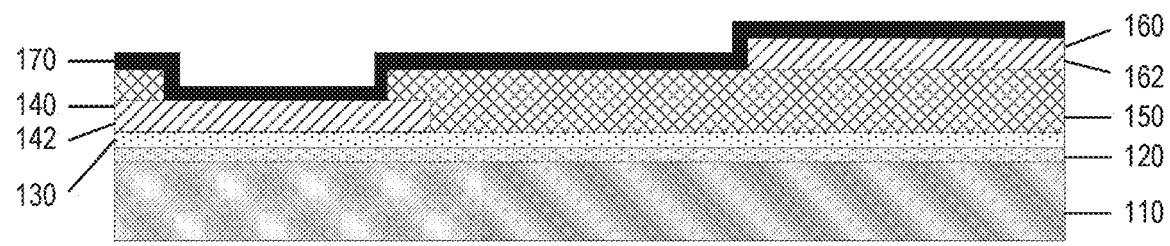

Referring to FIG. 1G, a layer of channel material 170 is deposited on the underlying structure (i.e., on second interconnect layer 160, on the exposed portions of the ILD 150, and on the exposed portions of the first interconnect layer 140). The layer of channel material 170 may have electrically tunable and/or temperature-dependent electrical properties, such that one or more of the channel material's electrical properties (e.g., conductivity, resistance, etc.) may depend on electrical signals (e.g., voltage) applied to the channel material and/or on the temperature of the channel material. In some embodiments, the layer of channel material 170 is transparent. For example, the layer of channel material 170 may be made of graphene having a thickness between, for example, 0.35 nm and a few nanometers. Alternatively, the layer of channel material 170 may be formed using another suitable material (e.g., a transition metal dichalcogenide (e.g., $MoS_2$, $WSe_2$, $WS_2$, etc.) or a metal oxide (e.g., ZnO)), and may have any suitable thickness.

Graphene may be deposited using a suitable graphene deposition process, e.g., a multi-step graphene deposition process. In the multi-step graphene deposition process, graphene/poly methyl methacrylate (PMMA) is transferred onto the structure being fabricated, nitrogen dried (e.g., to remove underlying water), baked for a relatively short time (e.g., 15 minutes) at a relatively low temperature (e.g., 80° C.), and baked again for a relatively long time (e.g., two hours) at a relatively high temperature (e.g., 130° C.). The foregoing steps of the graphene deposition process may evaporate underlying water and/or cause the PMMA to reflow, thereby promoting adhesion between the graphene and the underlying structure.

In some embodiments of the multi-step graphene deposition process, the PMMA is removed by immersing the PMMA in a solvent (e.g., acetone, N-methyl-2-pyrrolidone (NMP), etc.) for an amount of time suitable for removal of the PMMA (e.g., several hours), and the structure is then annealed (e.g., for three hours at 350° C. in 700 sccm $H_2$ and 400 sccm Ar) to reduce PMMA residue and to further promote adhesion between the graphene and the underlying materials. In other embodiments of the multi-step graphene deposition process, the PMMA is not removed and the structure is not annealed. Rather, the PMMA is retained and used as a layer of a multilayer etch mask in a subsequent processing step in which the graphene is etched.

Figure 1H:
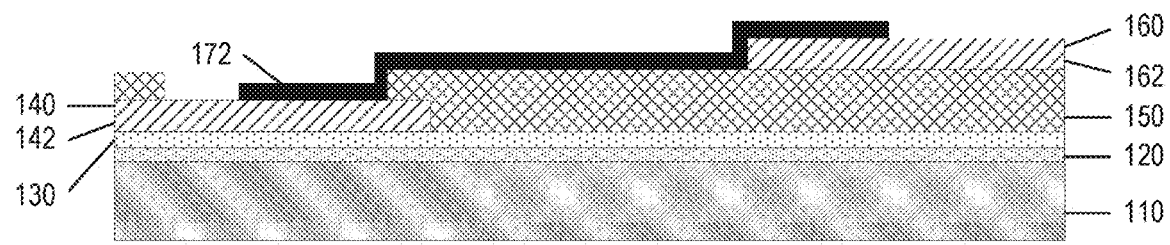
Figure 1I:
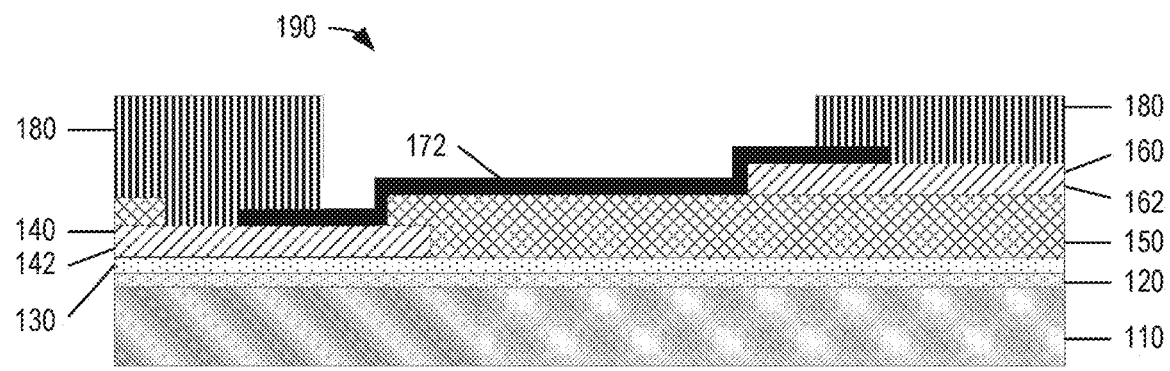
Figure 1J:
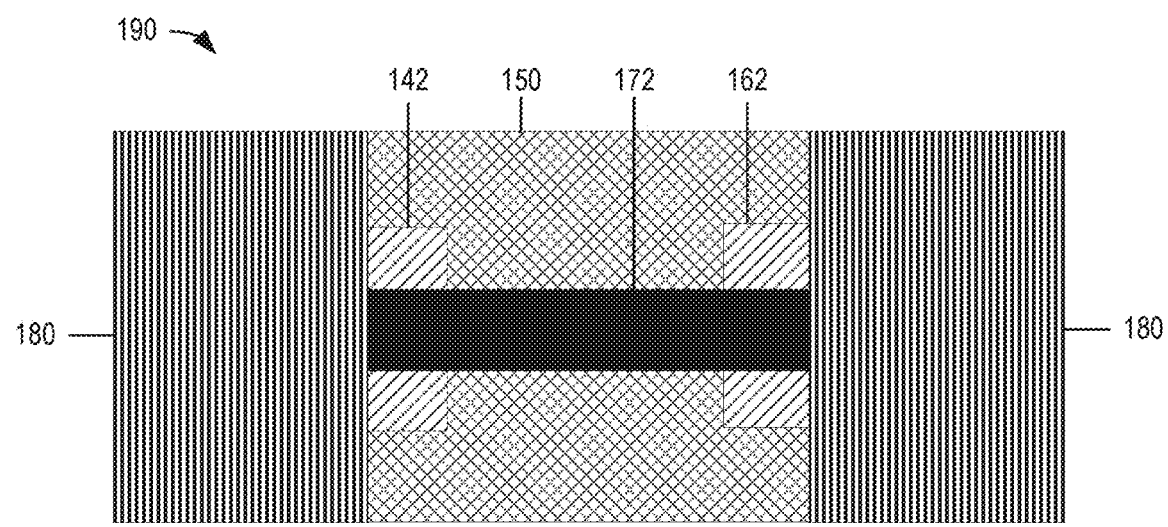
FIG. 1J is a top schematic view of the structure of FIG. 1I.

Referring to FIG. 1H, the layer of channel material 170 is etched to define one or more structures, for example, a channel region 172 of a device (e.g., a FET) to be formed in subsequent processing steps (see, e.g., the FET 190 in FIGS. 1I and 1J). In some embodiments, etching of the first layer is performed using a multilayer etch mask and oxygen plasma etching. A suitable etching technique (e.g., a method of forming a multilayer etch mask, etching the layer of channel material 170, and removing the multilayer etch mask) is discussed below and illustrated in FIGS. 3A-3F and 4. Other techniques for etching the layer of channel material 170 are possible. As discussed above, if the layer of channel material 170 is coated with PMMA when the channel material is deposited on the structure, the PMMA can be used as part of an etch mask in the step of etching the layer of channel material 170 and removed when the etch mask is removed. Alternatively, the PMMA coating can be removed, and the channel material can be recoated with an etch mask prior to etching the layer of channel material 170. Even in embodiments in which the etch mask includes a layer of PMMA on the channel material, the attributes of the first PMMA coating may be better suited for graphene deposition, and the attributes of the second PMMA coating may be better suited for an etching process.

As can be seen in FIG. 1H, etching the layer of channel material 170 may expose portions of the second interconnect layer 160 (e.g., portions of the drain region 162), portions of the interlayer dielectric 150, and/or portions of the first interconnect layer 140 (e.g., portions of the source region 142). In addition or in the alternative, etching the layer of channel material 170 may expose portions of the second interconnect layer that define the top gate electrode 530.

Referring to FIGS. 1I (a cross-sectional view) and 1H (a top view), an insulation layer 180 is deposited on the structure being fabricated (e.g., on the etched layer of channel material 170, the exposed portions of the second interconnect layer 160, the exposed portions of the interlayer dielectric 150, and/or the exposed portions of the first interconnect layer 140). The insulation layer may be a chemically inert electrical insulator. In some embodiments, the insulation layer 180 is transparent. For example, the insulation layer 180 may be made of transparent SU-8, which may be deposited using a suitable deposition method, e.g., spin coating. The transparent insulation layer 180 has a thickness, for example, between a few nanometers and hundreds of microns (e.g., 2.4 µm). Alternatively, the transparent insulation layer 180 may be formed using other suitable electrical insulators (e.g., epoxy, an oxide, a nitride, a polyimide, etc.) and/or deposition methods, and may have any suitable thickness. In general, the thickness is selected taking into consideration that thicker insulation layers 180 reduce parasitic capacitances to the interconnect layers 140 and 160 and increase flatness of the device, and thinner insulation layers 180 are selected to decrease surface roughness of the device.

Referring again to FIG. 1I, the insulation layer 180 is patterned to expose the channel region 172 or portions thereof. As can be seen in FIG. 1J, in addition to exposing the channel region 172 or portions thereof, the patterned insulation layer 180 may expose portions of the source region 142, the drain region 162, the ILD 150, and any other underlying layers. In embodiments in which the insulation layer 180 is made of a photo-definable resist material (e.g., an epoxy-based resist or a polyimide resist), the insulation layer 180 may be patterned using photolithography. In embodiments in which the insulation layer is made of a nitride or oxide, the insulation layer 180 may be defined using a wet etch process with good selectivity to the channel material 170, the interconnect layers 140 and 160, and the ILD 150.

After patterning the insulation layer 180, the structure may be baked (e.g., at 150° C. for five minutes), which may remove cracks in the insulation layer 180 and enhance its chemical resistance. The structure may then be coated (e.g., with PMMA) to protect the graphene during subsequent die sawing. After die sawing, the substrate and structure may be immersed in a solvent suitable for removing the PMMA (e.g., acetone, NMP, etc.) for a sufficiently long time period to remove the PMMA (e.g., several hours).

The fabrication process shown in FIGS. 1A-1J may be used to fabricate, among other things, a sensor device including one or more sensor circuits, which may be organized in rows and columns to form a sensor array. Each of the sensor circuits may include a FET 190, as shown in FIGS. 1H and 1J.

Figure 2:
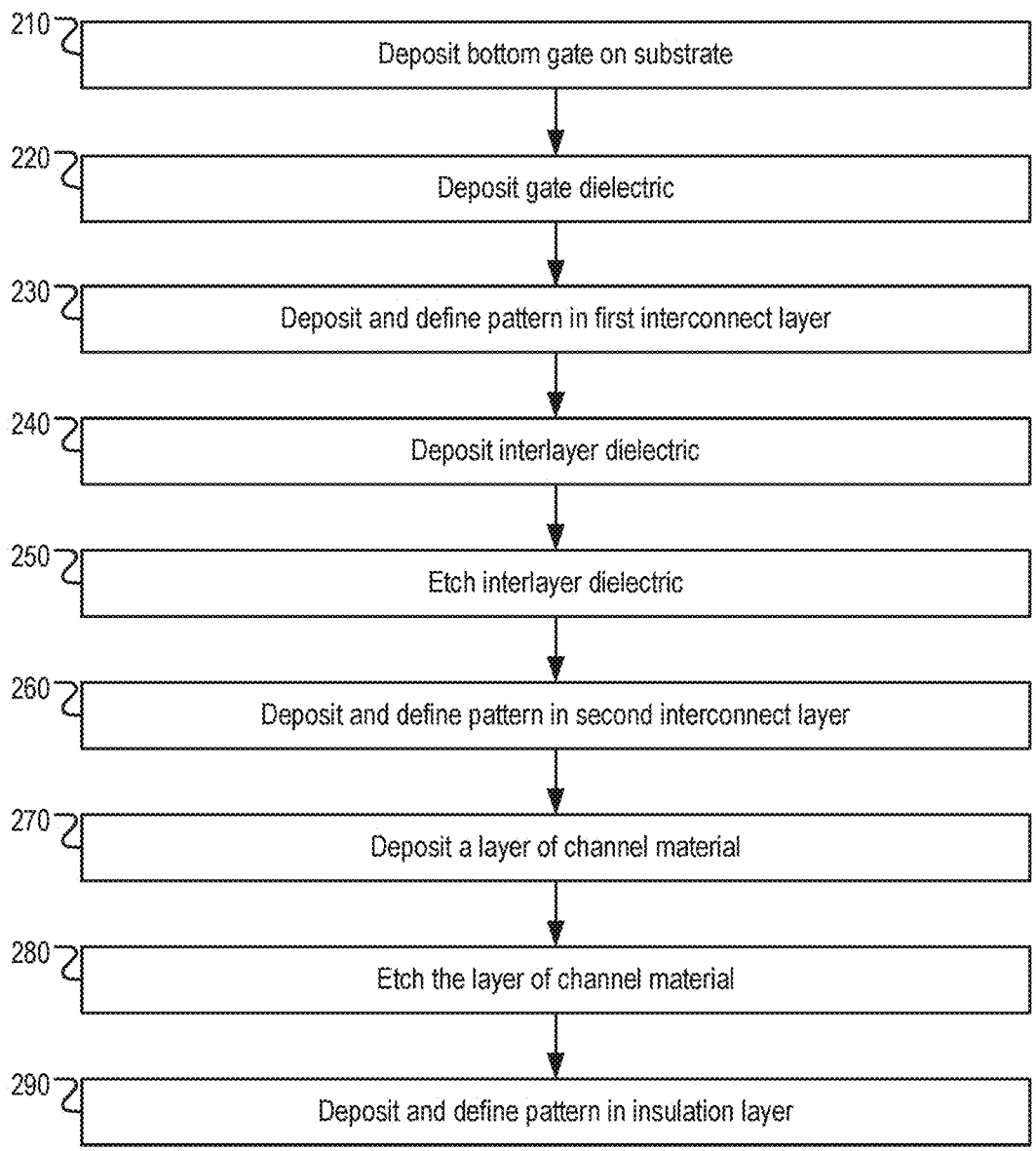
FIG. 2 is a flowchart of the process for fabricating a sensor device shown in FIGS. 1A-1J.

FIG. 2 is a flowchart of the sensor device fabrication process 200 illustrated in FIGS. 1A-1J. In step 210, the bottom gate 120 is deposited on the substrate 110 (see FIG. 1A). In step 220, a gate dielectric layer 130 is deposited on the bottom gate 120 (see FIG. 1B). In step 230, the first interconnect layer 140 is deposited and patterned on the gate dielectric layer 130 (see FIG. 1C). In some embodiments, portions of the patterned first interconnect layer 140 form (1) source region(s) 142 of one or more FETs 190 to be formed in subsequent processing steps and/or (2) column readout interconnects for columns of sensor circuits (e.g., FETs 190) in an array of sensor circuits to be formed in the subsequent processing steps.

In step 240, the interlayer dielectric (ILD) 150 is deposited (see FIG. 1D). In step 250, the ILD 250 is patterned (e.g., by etching) to expose portions of the patterned first interconnect layer 140 (e.g., portions of the source regions 142) (see FIG. 1E). In step 260, the second interconnect layer 160 is deposited and patterned (see FIG. 1F). In some embodiments, portions of the patterned second interconnect layer 160 form (1) drain region(s) 162 of one or more FETs 190 to be formed in subsequent processing steps, (2) row selection interconnects for rows of sensor circuits (e.g., FETs 190) in an array of sensor circuits to be formed in the subsequent processing steps, and/or (3) one or more top gate electrodes for the FETs 190. In step 270, the layer of channel material 170 is deposited (see FIG. 1G). The channel material may be, for example, graphene. In step 280, the layer of channel material 170 is patterned (see FIG. 1H) (e.g., using the etching process discussed below and illustrated in FIGS. 3A-3F and 4). In some embodiments, the patterned channel material 170 forms channel regions 172 of one or more FETs 190 to be formed in subsequent processing steps. In step 290, an insulation layer 180 is deposited and patterned to expose portions of the channel regions 172 (see FIGS. 1I and 1J). In some embodiments, the patterned insulation layer 180 also exposes portions of one or more top gate electrodes.

FIGS. 3A-3F illustrate a process for defining a multilayer etch mask, in accordance with an embodiment of the invention. The lithography and etching process illustrated in FIGS. 3A-3F may be used, for example, to etch a layer of channel material 170 during step 280 of the above-described process 200 for fabricating a sensor device, as illustrated in FIG. 1H. Other applications of the etching process illustrated in FIGS. 3A-3F are also possible.

Figure 3A:
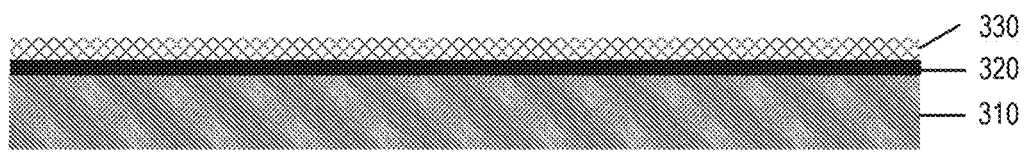
FIGS. 3A, 3B, 3C, 3D, 3E, and 3F are a series of schematic cross-sectional views of a structure illustrating a process for etching a layer of a material with a multilayer etch mask in accordance with some embodiments of the invention.

Referring to FIG. 3A, in accordance with embodiments of the invention, a substrate 310 may be rigid and compatible with subsequent processing steps for etching a layer of material 320 disposed on the substrate 310. Substrate 310 may include or consist essentially of transparent glass, silicon, silicon dioxide, etc.

In some embodiments, the layer of material 320 is the layer of channel material 170 illustrated in FIGS. 1G-1J. Accordingly, the layer of material 320 may be made of graphene. An ebeam resist layer 330 is formed on the layer of material 320. The ebeam resist layer 330 may be a positive ebeam resist material (e.g., PMMA) or a negative ebeam resist material (e.g., ma-N 2400, available from MicroChem Corp.). Other ebeam resist materials may be used (e.g., FEP-171, ZEP-520 manufactured by Zeon Chemicals, etc.). The ebeam resist layer 330 has a thickness, for example, between tens of nanometers and several hundred nanometers.

An example of a process for forming a film including a layer of graphene and PMMA are described above with reference to FIG. 1G. The PMMA provided during the transfer of the graphene may be used as an ebeam resist layer 330. Alternatively, the layer of material 320 and the ebeam resist layer 330 may be deposited on the substrate 310 in separate deposition steps. For example, a film including the layer of material 320 may be formed on the substrate 310, and the ebeam resist layer 330 may be deposited on the layer of material 320 using a suitable deposition process (e.g., spin coating).

After the formation of the layer of material 320 and the ebeam resist layer 330, the ebeam resist layer 330 is exposed to high-energy radiation. The high-energy radiation may include electron beam radiation or deep ultraviolet (UV) light (e.g., light with wavelengths less than 200 nm, or light with wavelengths between approximately 200 nm and 280 nm; for example, light with a wavelength of 248 nm). The irradiation dosage during the exposure process may be lower than the specific threshold energy for patterning the ebeam resist layer (e.g., a dosage of less than 500 mJ/cm$^2$ using deep UV light at a wavelength of 248 nm). In some embodiments, the irradiation dosage is relatively low, and the duration of the exposure step is relatively short (e.g., less than one hour, less than 30 minutes, less than 15 minutes, less than 10 minutes, between two minutes and 10 minutes, or between two minutes and five minutes). When the high-energy radiation is deep UV light, the exposure step may be performed using a UV light source (e.g., an OAI Model 30 UV Light Source or an ABM Stand Alone Exposure System).

Figure 3B:
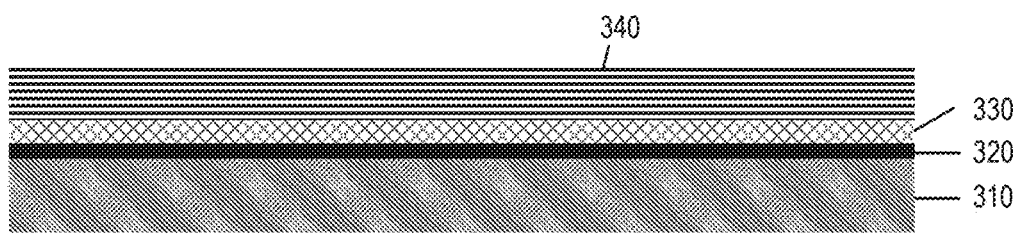

The ebeam resist layer 330 may be exposed to a suitable dose of high-energy radiation after the ebeam resist layer 330 is deposited (see FIG. 3A) and before a subsequent processing step in which a photoresist layer 340 is deposited (see FIG. 3B). In such embodiments, the exposure process is a flood exposure process that blanket exposes the ebeam resist layer 330 to the high-energy radiation. In addition or in the alternative, the ebeam resist layer 330 may be exposed to a suitable dose of high-energy radiation after subsequent processing steps in which the photoresist layer 340 is deposited (see FIG. 3B) and patterned (see FIG. 3C). In such embodiments, the portions of the ebeam resist layer 330 not covered by the patterned photoresist layer 340 are exposed to the high-energy radiation.

Referring to FIG. 3B, a photoresist layer 340 is deposited on the ebeam resist layer 330. As discussed above, in some embodiments, the ebeam resist layer 330 on which the photoresist layer 340 is deposited may have already been exposed to high-energy radiation. The photoresist layer 340 and the ebeam resist layer 330 may be made of different materials. For example, the photoresist layer 340 may be made of a positive photoresist material (e.g., SPR3012, polymethyl glutarimide (PMGI), phenol formaldehyde resin (e.g., novolac), etc.). Other ebeam resist materials may be used (e.g., a negative ebeam resist material, such as SU-8). The photoresist layer 340 may be deposited using a suitable deposition process, e.g., spin coating. The photoresist layer 340 has a thickness, for example, between a few hundred nm and several microns.

Figure 3C:
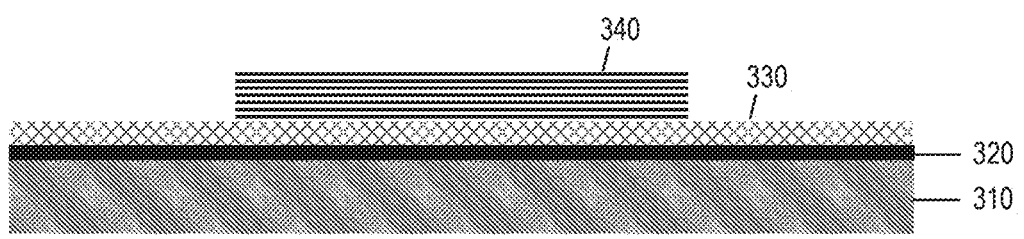
Figure 3D:
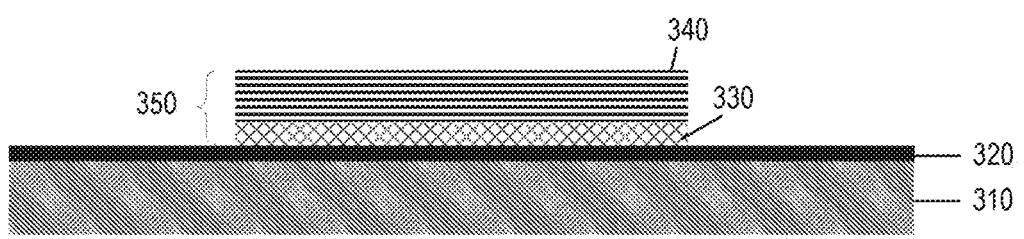

Referring to FIGS. 3C and 3D, the photoresist layer 340 and the ebeam resist layer 330 are patterned to define a multilayer etch mask 350. Referring to FIG. 3C, the photoresist layer 340 is patterned using any suitable technique (e.g., photolithographic exposure and development). After patterning the photoresist layer 340 and before patterning the ebeam resist layer 330, the portions of the ebeam resist layer 330 not covered by the patterned photoresist layer 340 may be exposed to high-energy radiation. Referring to FIG. 3D, the ebeam resist layer 340 (having been exposed to high-energy radiation before deposition of the photoresist layer 340 and/or after patterning of the photoresist layer 340) is patterned using any suitable technique (e.g., by developing the portions of the ebeam resist layer 330 not covered by the patterned photoresist layer 340). After patterning the photoresist layer 340 and the ebeam resist layer 330, the photoresist and ebeam layers collectively form a multilayer etch mask 350, with substantially the same pattern formed in the photoresist and ebeam resist layers.

Figure 3E:
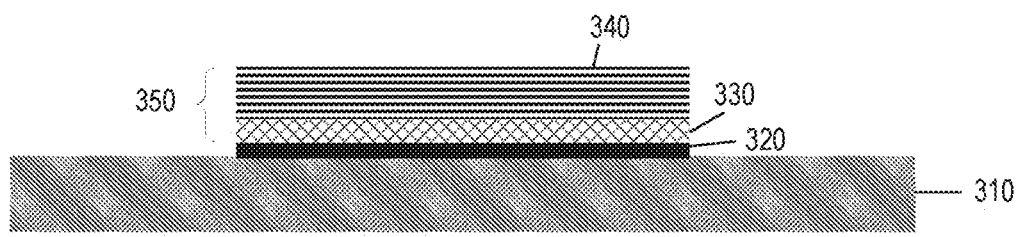

Referring to FIG. 3E, the layer of material 320 is etched (e.g., dry etched) to define one or more structures, for example, a channel region 172 of a device (e.g., a FET 190). The etchant may be an oxygen plasma or any other etchant suitable for removing portions of the layer of material 320. In some embodiments, the etchant has good etch selectivity to the underlying substrate 310. In some embodiments, the duration of the etching step may be relatively short (e.g., 15 seconds).

Figure 3F:

Referring to FIG. 3F, the multilayer etch mask 350 is removed, thereby exposing the feature(s) defined in the layer of material 320. In some embodiments, the multilayer etch mask 350 is removed by immersing the top surface of the device in a solvent (e.g., acetone, N-methyl-2-pyrrolidone (NMP), or another suitable solvent). The top surface of the device may be immersed in the solvent for a period suitable to remove the etch mask 350 (e.g., more than two hours, more than three hours, between three hours and eighteen hours, etc.).

The lithography and etching process of FIGS. 3A-3F may provide one or more advantages over other techniques for etching the layer of material 320. For example, the etching process of FIGS. 3A-3F may be faster than other etching techniques, for reasons discussed below, and/or may more reliably remove the etch mask from the layer of material 320 after the etching is performed, such that no residue (or less residue) of the etch mask remains on the layer of material 320 after removing the etch mask. These advantages may be particularly significant when the layer of material 320 is made of a carbon-based material (e.g., graphene). A conventional technique for etching a layer of material during a device fabrication process is to deposit and pattern a photoresist on the layer of material, etch the exposed portions of the underlying material, and remove the photoresist. However, this technique presents challenges when the underlying material is carbon-based, because photoresist materials are also generally carbon-based, and it is difficult to remove the photoresist selectively without leaving substantial residue or damaging the underlying material.

An alternative technique for etching a layer of material (e.g., carbon-based material) is to deposit an ebeam resist on the layer of material (see FIG. 3A), deposit and pattern a photoresist on the ebeam resist (see FIGS. 3B-3C), and then etch the ebeam resist and the underlying material together (without exposing the ebeam resist to high-energy radiation or developing the portions of the ebeam resist not covered by the patterned photoresist). Although this alternative technique has advantages over conventional etching techniques, the alternative technique generally requires a lengthy etching step (e.g., approximately four minutes) to etch both the ebeam resist and the underlying material, and the photoresist may melt onto the underlying material during the lengthy etching step, even when an etchant with good selectivity to the photoresist material is used. The melted photoresist material tends to stick to the underlying carbon-based material, making it difficult to remove the melted portions of the photoresist without leaving substantial residue or damaging the underlying material.

By contrast, after exposing the ebeam resist layer 330 to high-energy radiation as illustrated in FIGS. 3A-3F and discussed above, the ebeam resist layer 330 may be patterned quickly and reliably, and the multilayer etch mask 350 may be reliably removed from the underlying material(s) using process steps suitable for mass production. In particular, developing (rather than etching) the portions of the ebeam resist layer 330 not covered by the patterned photoresist layer 340 results in those portions of the ebeam resist layer being quickly removed with little or no residue remaining. After those portions of the ebeam resist layer 330 are removed, the layer of material 320 can be etched quickly (e.g., in 15 seconds), such that little or no melting of the photoresist layer 340 occurs. A solvent is then used to remove the multilayer etch mask 350, with little or no residue remaining on the underlying material.

Figure 4:
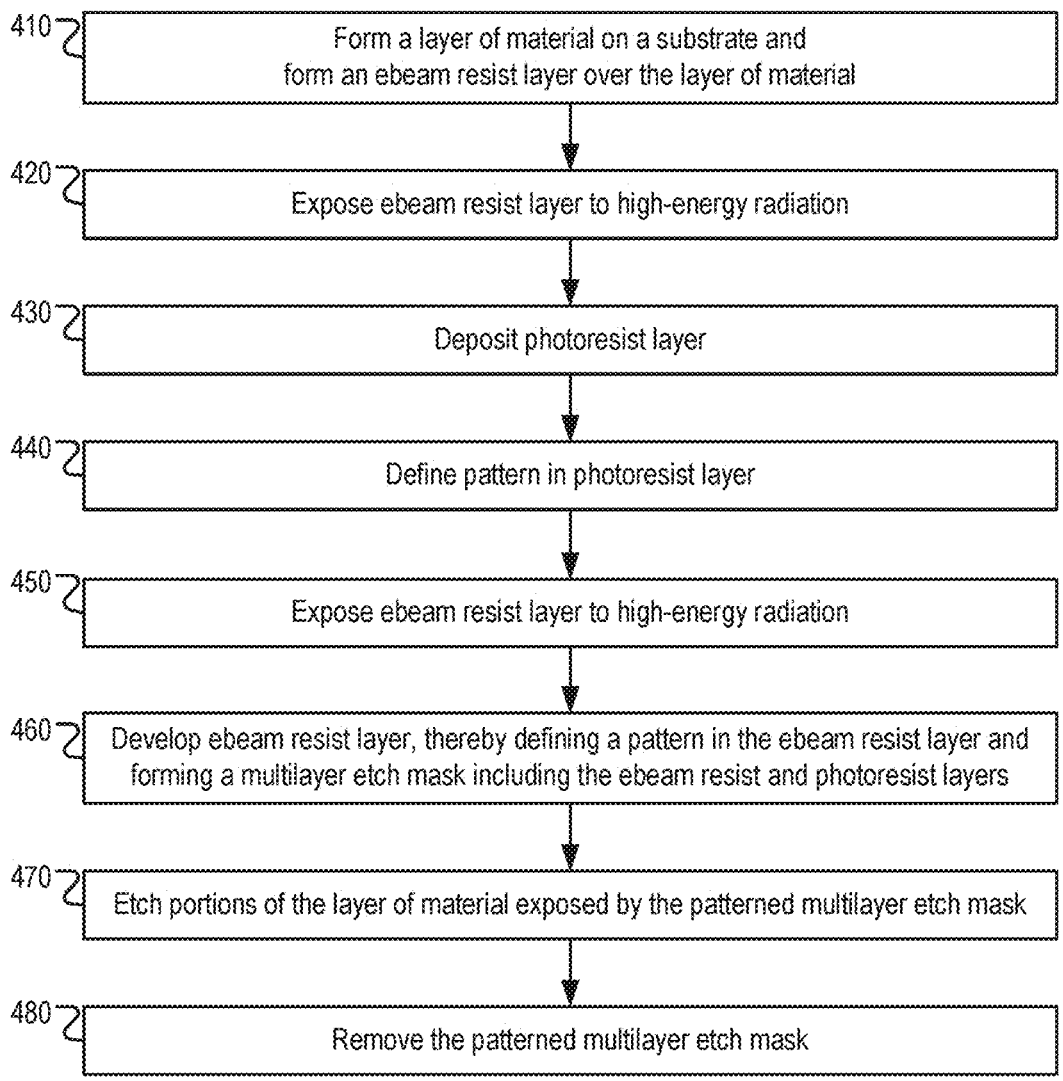
FIG. 4 is a flowchart of the process shown in FIGS. 3A-3F for etching a layer of a material with a multilayer etch mask.

FIG. 4 is a flowchart of the lithography and etching process 400 illustrated in FIGS. 3A-3F. In step 410, a layer of material 320 is formed on a substrate 310 and an ebeam resist layer 330 is formed on the layer of material 330 (see FIG. 3A). In step 420, the ebeam resist layer 330 is flood exposed to high-energy radiation (e.g., electron beam radiation or deep UV light). The irradiation dosage during the exposure step may be lower than the specific threshold energy for patterning the ebeam resist layer 330. In step 430, a photoresist layer 340 is deposited on the ebeam resist layer 330 (see FIG. 3B), and in step 440, a pattern is defined in the photoresist layer 340 (see FIG. 3C). In step 450, the ebeam resist layer is exposed to high-energy radiation. The irradiation dosage may be lower than the specific threshold energy for patterning the ebeam resist layer 330. Optionally, either step 420 or step 450 may be omitted; the ebeam resist layer 330 may be exposed to high-energy radiation before depositing the photoresist layer 340 or after depositing and patterning the photoresist layer.

In step 460, the ebeam resist layer 330 is developed, thereby defining the pattern of photoresist layer 340 in the ebeam resist layer and forming a multilayer etch mask 350 including the patterned ebeam resist and photoresist layers (see FIG. 3D). In step 470, portions of the layer of material 320 exposed by the patterned multilayer etch mask 350 are etched, thereby defining a pattern in the layer of material 320 (see FIG. 3E). In step 480, the multilayer etch mask 350 is removed (see FIG. 3F).

In the example of FIG. 3A-3F and in the example of FIG. 4, advantages are realized by exposing the ebeam resist layer 320 to high-energy radiation. Exposing the ebeam resist layer 320 to the high-energy radiation may be particularly beneficial when the ebeam resist layer 320 is a positive ebeam resist, because exposure to the high-energy radiation allows the exposed portions of the resist to be quickly and cleanly removed in a development step. Alternatively, the same or similar benefits may be realized by using a negative ebeam resist for layer 320, without exposing the negative ebeam resist to high-energy radiation. When a negative ebeam resist is used, the portions of the ebeam resist layer 320 uncovered by the patterned photoresist layer 330 may be quickly and cleanly removed in a development step, without exposing those portions of the ebeam resist to high-energy radiation. However, when this approach is used, there is a risk of removing portions of the ebeam resist under the patterned photoresist, thereby undercutting the photoresist. This risk can be eliminated or reduced by exposing the portions of the ebeam resist that will ultimately form a layer of the etch mask to high-energy radiation before depositing the photoresist layer 330.

As discussed above, the fabrication techniques illustrated in FIGS. 1A-1J, 2, 3A-3F, and 4 can be used, for example, to fabricate one or more FETs 190. Referring to FIG. 1I, the channel 172 of the FET 190 may have electrically tunable electrical properties, such that one or more of the channel's electrical properties (e.g., conductivity) may depend on electrical signals (e.g., voltage) applied to the channel 172. In some embodiments, a suitable voltage ("bias voltage") may be applied to the bottom gate 120 to bias the electrical properties of the channels 172 of one or more FETs 190. The range of suitable bias voltages may be as low as plus or minus tens of millivolts (or even zero millivolts) or as high as plus or minus tens or hundreds of volts (e.g., a few volts). The selected bias voltage may depend on the thickness and capacitance of the bottom gate 120. The selected bias voltage may also depend on how the FETs 190 are used (e.g., as electrolyte-gated FETs (EGFETs), as sensors of electrical activity in a cell culture, as chemical sensors, as temperature sensors, etc.).

In some embodiments, a single bottom gate 120 may be disposed under all the FETs 190 and may be used to bias all the FETs 190 disposed on the substrate 110. In some embodiments, different bottom gates 120 may be disposed under different subsets of the FETs 190 and may be used to selectively bias the different subsets of FETs. Increasing the number of individually-controlled bottom gates 120 affords finer-grained control over the bias voltages (and channel characteristics) of the FETs 190, but also increases the number interconnects used to provide the bias voltages.

Referring to FIG. 5A, when the FET 190 is used as an EGFET, the FET 190 may be immersed in an electrolyte solution 510 (e.g., a specimen including a cell culture medium and a cell culture), such that the electrolyte solution 510 is in fluidic communication (e.g., direct physical contact) with the FET's channel 172. The electrolyte solution 510 may function as the medium through which a top gate voltage is applied to the FET 190, such that the gate-source voltage of the FET 190 (and therefore the operation of the FET 190) depends on the voltage applied across the electrolyte solution 510.

To facilitate application of a voltage across the electrolyte solution 510, a reference electrode 520 may be at least partially immersed in the electrolyte solution 510. In operation, a voltage may be applied to the reference electrode 520, such that the reference electrode attracts charges (e.g., ions, dipoles) of a first polarity and repels charges of a second, opposite polarity. To facilitate the selective attraction of charges, the reference electrode 520 may be made of a conductive material (e.g., silver (Ag), silver chloride (AgCl), and/or saturated calomel). In addition, the channel 172 may attract charges of the second polarity and repel charges of the first polarity (e.g., because of the bias voltage applied to the channel 172 via the bottom gate 120). Thus, the application of a voltage ($V_G$) between the reference electrode 520 and the channel region 172 causes charges of different polarities in the solution 510 to migrate to the reference electrode 520 and the channel region 172, respectively. Changes in the electrical attributes of the solution 510 then act to modulate the charge composition near the FET's channel region 172, and these changes in charge composition can be detected and measured by monitoring the output signals (e.g., drain-source voltage $V_{DS}$, drain-source current $I_{DS}$, etc.) produced by the FET 190.

Referring to FIG. 5B, as an alternative to a reference electrode 520, a top gate electrode 530 may be used to facilitate application of a voltage across the electrolyte solution 510. (In the example of FIG. 5B, the electrolyte solution 510 is omitted to avoid obscuring the view of other components of the device.) The top gate electrode 530 may be at least partially immersed in the electrolyte solution 510. In operation, a voltage may be applied to the top gate electrode 530, such that the top gate electrode attracts charges of a first polarity and repels charges of a second, opposite polarity. To facilitate the selective attraction of charges, the top gate electrode 530 may be made of a conductive material (e.g., the same conductive materials used to fabricate the first interconnect layer 140 or the second interconnect layer 160). As discussed above, the channel 172 may attract charges of the second polarity and repel charges of the first polarity (e.g., because of the bias voltage). Thus, the application of a voltage ($V_G$) between the gate electrode 530 and the channel region 172 causes charges of different polarities in the solution 510 to migrate to the gate electrode 530 and the channel region 172, respectively. Changes in the electrical attributes of the solution 510 then act to modulate the charge composition near the FET's channel region 172, and these changes in charge composition can be detected and measured by monitoring the output signals (e.g., drain-source voltage $V_{DS}$, drain-source current $I_{DS}$, etc.) produced by the FET 190.

In some embodiments, the fabricated sensor device may include a single top gate electrode 530 shared by all the FETs 190. In some embodiments, the FETs 190 may be divided into subsets, and each subset of FETs may be placed in fluidic contact with a respective electrolyte solution. In such embodiments, the sensor device may include a different top gate electrode 530 for each subset of FETs, and the electrolyte solution corresponding to a particular subset of FETs may also be in fluidic contact with the top gate electrode corresponding to that subset of FETs. In this way, the sensor device may be capable of monitoring multiple distinct electrolyte solutions simultaneously.

In some embodiments, the fabricated sensor device may include two or more top gate electrodes corresponding to the same FET or set of FETs. In such embodiments, the top gate electrodes corresponding to a particular FET or set of FETs may be made of different materials (e.g., different conductive materials), which may exhibit different work functions and therefore may be selectively activated to produce different gating effects. An example has been described in which one or more top gate electrodes are formed in the first and/or second interconnect layers, using the same materials as the first and/or second interconnect layers. To fabricate top gate electrodes made of materials other than the materials used in the first and second interconnect layers 140 and 160 (e.g., top gate electrodes made of transparent ZnO or made of any suitable metal, including, without limitation, Ni, Al, Ti, Au, Pt, Pd, and/or Ag), the top gate electrodes may be defined in other interconnect layers (e.g., a third interconnect layer, a fourth interconnect layer, etc.), which may be formed using process steps similar to the steps illustrated in FIGS. 1C-1F.

In some embodiments, the top gate electrodes are coupled to interconnects (e.g., interconnects defined in the same layers as the electrodes). Signals (e.g., voltages) may be applied to the interconnects coupled to the top gate electrodes to bias the top gate electrodes. In some embodiments, multiple top gate electrodes may share an interconnect and therefore share a bias voltage. In some embodiments, different top gate electrodes may have their own interconnects, and may therefore be biased at different bias voltages.

Referring to FIG. 6, a sensor device 600 may include multiple sensor circuits 610, each of which may include a FET 190 fabricated in accordance with the fabrication process 200 described above in connection with FIGS. 1A-1J and 2, and optionally 3A-3G and 4. Each sensor circuit 610 may also include portions of a row selection interconnect 620 coupled to the drain region 162 of the sensor circuit's FET 190, portions of a column readout interconnect 630 coupled to the source region 142 of the sensor circuit's FET 190, a bottom gate 120 operable to bias the voltage of the channel region 172 of the sensor circuit's FET 190, and/or a top gate electrode 530 operable to apply a voltage across the FET's gate. In some embodiments, a reference electrode 520 may be used to apply the voltage across the FET's gate.

In some embodiments, the sensor device 600 includes M*N FETs 190 organized in a sensor array 640 having M rows and N columns, and M+N leads for row selection and column readout functions. Using the fabrication process 200, relatively large sensor arrays 640 may be reliably fabricated with relatively high yields. For example, sensor arrays 640 as large as 16 FETs by 16 FETs or larger may be reliably fabricated with yields of 80%, 90%, or even 100%.

In some embodiments, the number of rows M and the number of columns N are both powers of two (e.g., 2, 4, 8, 16, 32, 64, etc.). In the example of FIG. 6, the number of rows M=4 and the number of columns N=4. Other values of M and N may be used, and in some embodiments the number of rows M and the number of columns N are not equal. Also, in the example of FIG. 6, the subscript XY assigned to each FET 190 indicates the row (X) and the column (Y) in which the FET 190 is disposed.

Figure 8:
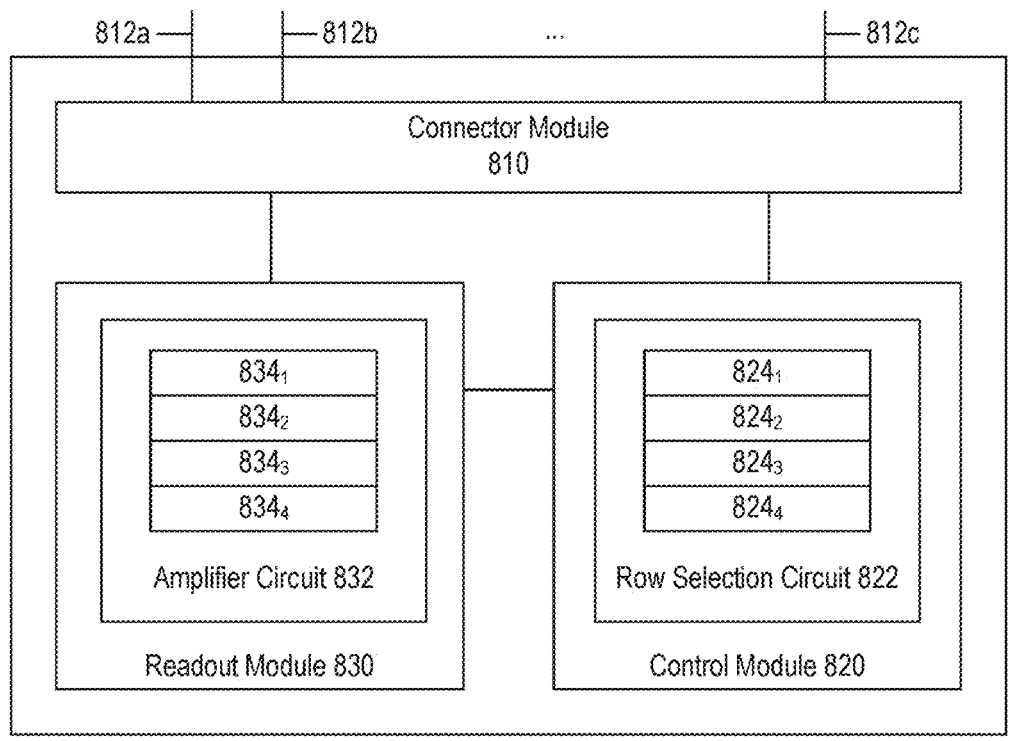
FIG. 8 is a block diagram of a readout device in accordance with an embodiment of the invention.

In each row of FETs, the drain regions 162 of the FETs 190 may be coupled to the same row selection interconnect 620. In the example of FIG. 6, the subscript X assigned to each row selection interconnect 620 indicates the row (X) that is selected when the row selection interconnect is activated. Thus, in FIG. 6, row selection interconnect $620_X$ is coupled to the drains 162 of FETs $190_{X1}$, $190_{X2}$, $190_{X3}$, and $190_{X4}$. In some embodiments, each of the row selection interconnects $620_X$ is also coupled to a corresponding pin or pad $622_X$, which may be coupled to a row selection circuit of a readout device (e.g., a readout device 800 as shown in FIG. 8 and described below). In some embodiments, the row selection interconnects 620 are transparent.

In each column of FETs, the source regions 142 of the FETs 190 may be coupled to the same column readout interconnect 630. In the example of FIG. 6, the subscript Y assigned to each column readout interconnect 630 identifies the column (Y) of FETs that have their source regions coupled to the column readout interconnect. Thus, in FIG. 6, column readout interconnect $630_Y$ is coupled to the sources 142 of FETs $190_{1Y}$, $190_{2Y}$, $190_{3Y}$, and $190_{4Y}$. In some embodiments, each of the column readout interconnects $630_Y$ is also coupled to a corresponding pin or pad $632_Y$, which may be coupled to a readout module of a readout device 800. In some embodiments, the column readout interconnects 630 are transparent.

Some or all portions of the sensor device 600 may be transparent. In some embodiments, the sensor array 640 is transparent. Alternatively, the sensor array 640 may be locally transparent. For example, the row selection interconnects 620, row selection pins 622, column readout interconnects 630, and column readout pins 632 may not be transparent, but the other portions of the sensor array 640 may be transparent.

In the example of FIG. 6, the bottom gate(s) 120 and the top gate electrode(s) 530 are not shown. However, respective interconnects coupled to the bottom gate(s) 120 and the top gate electrode(s) 530 may be coupled to pins, which may be coupled to a control module of a readout device 800. FIG. 6 also does not show any reference electrode(s) 520 that may be used in connection with the sensor device 600.

The sensor array 640 may provide advantages over other sensor array designs. For example, in one type of sensor array ("type T1"), each sensor is connected to at least one unshared wire. Because the sensors are accessed individually, the integration of semiconductor material into the type-T1 sensor array can be avoided, which allows portions of these types of sensors to be flexible or transparent. However, because the type-T1 sensor array includes at least one distinct wire per sensor, a sensor array with N×M sensors includes on the order of N×M wires. Using on the order of N×M output wires as opposed to N+M output wires is generally impractical for applications requiring large numbers of sensors.

Another type of sensor array ("type T2") takes advantage of wire sharing, employs an integrated semiconductor material, and is flexible. Type-T2 sensor arrays are flexible because normally rigid semiconductor materials such as silicon become flexible when made very thin. The process of acquiring such thinned down semiconductor material from a bulk crystal and integrating it into the sensor array generally adds cost and complexity to the design and the sensor fabrication process. In addition, this technology again relies on silicon, which is opaque, making type T2 sensor arrays ill-suited for compound microscope imaging and other applications in which transparent sensor arrays are preferred.

Figure 7A:
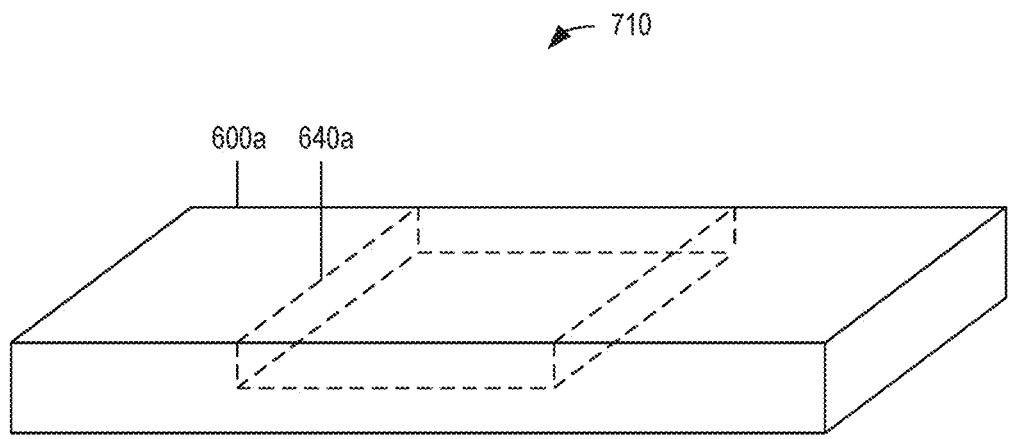
FIG. 7A is a block diagram of a transparent slide with sensors in accordance with an embodiment of the invention.

Embodiments of the sensor device 600 may be used for a wide variety of applications. Referring to FIG. 7A, a slide 710 in accordance with embodiments of the invention may be suitable for use in microscopy. The slide 710 incorporates a sensor device 600a, which includes a sensor array 640a integrated on a transparent substrate, such as transparent glass. The slide 710 may be used to monitor electrical and/or chemical attributes or activities of a specimen disposed on the slide via the sensor array 640a, while simultaneously monitoring other attributes or activities of the specimen via microscopy. For example, the slide 710 may be used to monitor cell cultures. In some embodiments, the slide 710 can be used to monitor the effects of compounds (e.g., drugs or drug candidates) on living cells (e.g., networks of electrogenic cells).

To facilitate observation of the specimen via microscopy, the slide 710 may be transparent or locally transparent. For example, the entire slide 710 and/or the entire sensor array 640a may be transparent. Alternatively, portions of the sensor array 640a may be transparent (e.g., the FETs 190, including the channel regions 172, drain regions 162, and source regions 142), and other portions of the sensor array 640a (e.g., the row selection interconnects 620 and/or the column readout interconnects 630) may be non-transparent. The transparent or locally transparent slide 710 may be fabricated using the fabrication process 200. In some embodiments, the sensor device 600*a* of the slide 710 may include a single sensor circuit 610 with a single FET 190, rather than an array 640 of sensor circuits 610.

To prepare a slide for monitoring (e.g., simultaneous monitoring) of a specimen using the sensor device 600*a* and a microscope, the specimen may be placed in fluidic communication with the sensor array 640*a*. The specimen may include, for example, a cell culture and a cell culture medium in which the cell culture is disposed. As discussed above, the cell culture can include electrogenic cells and the cell culture medium can include a compound (e.g., a drug candidate). Other cell cultures, cell culture media, or specimens may be used. In some embodiments, a stain is added to the specimen to enhance microscopic visualization of the specimen or portions thereof. The specimen may be placed in fluidic communication with the sensor array 640*a* by placing the specimen on the top surface of the slide 710. As discussed above, the fabrication process 200 can be used to fabricate sensor arrays 640*a* in which the channel regions 172 of the FETs 190 are exposed to the environment. Thus, placing the specimen on the top surface of the slide 710 over the sensor array 640*a* may result in the specimen being in fluidic communication (e.g., physical contact) with the channel regions 172 of the FETs 190.

When the channel regions 172 of the FETs 190 are in fluidic communication with the specimen, the FETs 190 can detect electrical and/or chemical attributes or activities of the specimen. For example, the specimen may include cells in an ionic solution. When a bias voltage is applied to the channel region 172 of a FET 190 (e.g., via a bottom gate 120), the channel region 172 attracts charges (e.g. ions, dipoles) of a first polarity and repels charges of a second (opposite) polarity. As discussed above, when monitoring a specimen in fluidic communication with the FET 190, a suitable bias voltage applied to the channel region 172 via the bottom gate 120 may be in the range of zero millivolts or plus or minus tens of millivolts to plus or minus tens or hundreds of volts, depending on the thickness and/or capacitance of the gate dielectric layer 130. Optionally, when a suitable voltage is applied to the top gate electrode 530, it attracts charges of the second polarity and repels charges of the first polarity. When monitoring a specimen in fluidic communication with the FET 190, a suitable voltage applied to the top gate electrode 530 may be in the range of plus or minus several volts. As discussed above, the application of a voltage ($V_G$) across the specimen (between the top gate electrode 530 and the channel region 172), causes charges of different polarities in the specimen to migrate to the gate electrode and the channel region 172, respectively. Changes in the electrical attributes of the specimen then act to modulate the charge composition near the FET's channel region 172, and these changes in charge composition can be detected and measured by monitoring the output signals (e.g., drain-source voltage $V_{DS}$, drain-source current $I_{DS}$, etc.) produced by the FET 190.

Likewise, activities of portions of the specimen that cause changes in the charge composition near the FET 190 channel region can be detected by monitoring the output signals of the FETs 190. For example, the specimen may include certain types of cells (e.g., electrogenic cells, such as the cells that form neurons) that eject ions through their membranes when the cells fire. The ejection of ions from the cells into the cell culture medium changes the ion concentration in the portion of the specimen near the cell, which can alter the charge composition near channel region of the FETs 190 and therefore alter the output signals provided by such FETs. Thus, such cellular activity can be detected by monitoring the output signals produced by the FETs 190.

Furthermore, chemical attributes or activities of the specimen that cause changes in the electrical properties of the channel regions 172 of the FETs 190 can be detected by monitoring the output signals of the FETs. Some examples of chemical attributes of a specimen that may be monitored include a nutrient level of a cell culture medium, a pH of a cell culture medium, etc.

Before or after placing the specimen in fluidic communication with the sensor array 640*a*, the slide 710 can be (1) positioned on a microscope for observation of the specimen, and (2) communicatively coupled to a readout device 800 operable to process the signals produced by the FETs 190 in the sensor array 640*a*. The microscope may be used to view or image the specimen while the specimen is monitored by the sensor array 640*a*. In some embodiments, the specimen can include a fluorescent material, and the microscope can be a fluorescence microscope.

Some embodiments of the slide 710 may be used for life sciences research and/or in the pharmaceutical industry. Some embodiments provide economical techniques for chemically and electrically monitoring cell cultures. Some embodiments allow for monitoring of nutrient depletion or changing pH during cell culture. Some embodiments allow users to study the effects of drugs on networks of electrogenic cells, which can be useful in the development of drugs that act on the brain or heart.

Figure 7B:
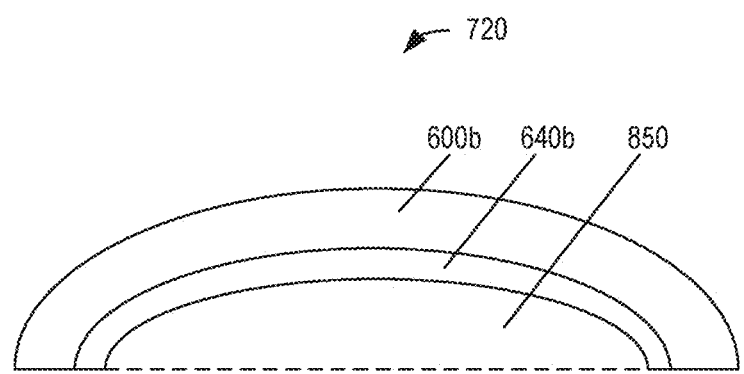
FIG. 7B is a cross-sectional view of a schematic of a flexible sensor device in accordance with an embodiment of the invention.

Referring to FIG. 7B, a flexible sensor 720 is provided. The flexible sensor 720 may be used to monitor parameters (e.g., temperatures, electrolyte levels, etc.) of an object, a surface of the object, and/or the object's environment. For example, the flexible sensor 720 may be used to determine surface temperatures at locations on or adjacent to a surface, which may be planar or non-planar (e.g., curved or irregularly shaped). As another example, the flexible sensor 720 may be used to monitor exothermic reactions by determine temperatures at locations on or adjacent to the sensor during such reactions.

The flexible sensor 720 includes a sensor device 600*b*. To facilitate monitoring of parameters of non-planar surfaces, the sensor device 600*b* includes a sensor array 640*b* integrated on a flexible substrate. The flexible substrate may be made of a flexible polymeric material. The flexible substrate may have an elastic modulus between 0.01 GPa and 100 GPa (e.g., 5 GPa), and the elastic modulus of the flexible sensor 720 may be substantially equal to the elastic modulus of the flexible substrate.

In some embodiments, the flexible sensor 720 is transparent or locally transparent. For example, the entire sensor 720 or the entire sensor array 640*b* may be transparent. Alternatively, portions of the sensor array 640*b* (e.g., the FETs 190, including the channel regions 172, drain regions 162, and source regions 142) may be transparent, and other portions of the sensor array 640*b* (e.g., the row selection interconnects 620 and/or the column readout interconnects 630) may be non-transparent. The flexible sensor 720 may be fabricated using the fabrication process 200. In some embodiments, the sensor device 600*b* of the flexible sensor 720 may include a single sensor circuit 610 with a single FET 190, rather than an array 640 of sensor circuits 610.

To monitor parameters of an object or the object's environment at locations on or adjacent to a surface of the object, the flexible sensor 720 may be placed on the surface of the object, such that a surface of the flexible sensor 720 (e.g., a surface of the flexible polymer substrate 110 or a surface of an insulating layer 180 overlying the FETs 190) is in contact with and conforms to at least a portion of the surface of the object. The object may be a human body, an airplane, a space shuttle, or any other suitable object. In the example of FIG. 7B, the flexible sensor 720 is placed on an upper surface of an object 850, such that the surface of the insulating layer 180 overlying the sensor array 640*b* is in contact with and conforms to the upper surface of the object 850.

When the flexible sensor is placed on the surface of the object, each of the FETs 190 is disposed at a respective location adjacent to the surface of the object. Parameters of the object/environment at those locations may cause changes in the electrical properties of the channel regions 172 of the FETs, and therefore may cause changes in the input-output characteristics of the FETs. For example, in embodiments in which the channel regions 172 are formed from graphene, the resistance of each channel region 172 may depend on the temperature of the channel region and/or on the electrolyte levels of a fluid (e.g., ambient air) that is in fluidic communication with the channel region. Thus, the input-output characteristics of the FETs 190 may depend on parameters of the object/environment that modulate the input-output characteristics of the FETs 190, such as temperatures and electrolyte levels.

The values of such parameters can be determined by applying input signals (e.g., gate-source voltages $V_{GS}$) to the FETs, measuring the corresponding output signals provided by the FETs 190 (e.g., drain-source voltage $V_{DS}$, drain-source current $I_{DS}$, etc.), and determining the relationships between the input signals and the corresponding output signals. In some embodiments, the sensor device 600*b* is communicatively coupled to a readout device 800 that provides suitable input signals and detects the corresponding output signals. For example, for flexible sensing applications, the readout device 800 may apply a bias voltage of 200 mV to the channel region 172 of the FET 190 via the bottom gate 120. The parameter values sensed by the flexible sensor 720 can be used, for example, to generate a two-dimensional map of the values of the monitored parameters (e.g., a heat map).

In some embodiments, the flexible sensor 720 may be used as a type of inexpensive, smart skin sensor, which can be wrapped around an object to monitor parameters such as surface temperature. The sensor array area can be made very large by increasing the spacing between sensor circuits and/or by increasing the overall number of sensor circuits. The flexible sensor device 720 may be fastened to the surface of an object. Temperature changes on the surface of the object can cause the conductivity of the sensor circuits' channel material to change. In this way, it is possible to generate two-dimensional heat maps of the object's surface.

In some embodiments, the flexible sensor 720 may be very large. For example, the flexible sensor 720 may have a diameter of 100 inches or a surface area of 7850 square inches. In contrast to sensor devices fabricated on silicon wafers, which are generally limited to a diameter of 12 inches due to constraints of the corresponding fabrication processes, the size of the flexible sensor 720 may be limited primarily by the size of the flexible substrate, which can be quite large.

Referring to FIG. 8, a readout device 800 may be configured to communicate with and control the operation of the sensor device 600. In some embodiments, the readout device 800 includes a connector module 810 configured for communicative coupling with the sensor device 600 via pins or pads 812, a control module 820 configured to send control signals to the sensor device 600 via the connector module 810, and a readout module 830 configured to receive output signals from the sensor device 600 via the connector module 810 and process those signals to determine parameters of the environment sensed by the sensor device 600.

The connector module 810 is configured for communicative coupling with the sensor device 600 via the pins (or pads) 812. The pins 812 may include output pins 812*a* for coupling to each of the row selection pins 622 of the sensor device 600, input pins 812*b* for coupling to each of the column readout pins 632, and output pins 812*c* for coupling to each of the bottom gates 120 and each of the top gate electrodes 530 of the sensor device 600. The connector module 810 may provide high pin density and low resistance and capacitance on the pins 812. In some embodiments, the connector module 810 is a flat flexible cable (FFC) connector.

The control module 820 controls the operation of the sensor device 600 by sending signals to the sensor device via the connector module 810. For example, the control module 820 may bias the gate voltages $V_G$ of the FETs 190 by driving voltages through the connector module 810 and the output pins 812*c* to the bottom gate(s) 120 and/or the top gate electrode(s) 530 of the sensor device 600. In some embodiments, the control module 820 includes a row selection circuit 822 with M row selection switches 824, each of which is configured to communicatively couple to a corresponding row selection interconnect 620 on the sensor device 600, via the control module 810 and the output pins 812*a*. Each of the row selection switches 824 may include a switching component (e.g., a FET). The row selection circuit 822 may use the row selection switches 824 to selectively activate individual rows of FETs 190 on the sensor device 600, while deactivating all rows of FETs other than the selected row. For example, the row selection circuit 822 may activate a particular row selection switch 824$_X$ coupled to a particular row selection interconnect 620$_X$, and may drive a current to the drains of the FETs 190 in the selected row via the row selection switch and the row selection interconnect. Alternatively, the row selection circuit 822 may apply a voltage to the drains of the FETs 190 in the selected row.

The readout module 830 reads output signals received from the sensor device 600 via the connector module 810. In some embodiments, the readout module 830 includes an amplifier circuit 832 with N amplifiers 834, each of which is configured to communicatively couple to a corresponding column readout interconnect 630 on the sensor device 600, via the control module 810 and the input pins 812*b*. The amplifier circuit 832 may use the amplifiers 834 to amplify the output signals (e.g., drain-source voltages $V_{DS}$, drain-source currents $I_{DS}$, etc.) received from the FETs 190 in the row of FETs selected by the row selection circuit 822. Each amplifier 834 may include one or more amplifier devices, for example, voltage amplifiers (e.g., common source amplifiers), transimpedance amplifiers, etc. In some embodiments, the readout module 830 processes the amplified output signals of the sensor device 600 to determine values of the attributes sensed by the sensor device 600. Alternatively, the readout device 800 may be coupled to a processing device, which may process the amplified output signals to determine values of the sensed attributes.

When a row of FETs 190 on the sensor device is selected by the row selection circuit 822, each of the selected FETs 190 may be configured as an amplifier. For a given sensing application, the quality and accuracy of the sensed parameter values may depend on the selection of a suitable amplifier configuration for the FETs 190. For instance, transconductance amplifier configurations may be well suited for chemical sensing applications. Transconductance amplifier configurations, however, may not be well suited for monitoring electrically active cells because of inadequate gain (e.g. signal suppression). To address potential problems of low gain (e.g., signal suppression) associated with the use of FET 190 as a transconductance amplifier, the FET 190 may be configured as a voltage amplifier (e.g., a common source amplifier, such as a common source amplifier with source degeneration). The use of a common source amplifier configuration may be particularly beneficial in embodiments in which the sensor device 600 forms a transparent slide 600.

The readout device 800 may be integrated on a second substrate separate from the substrate 110 of the sensor device 600, or the components of the readout device 800 may be mounted on a printed circuit board (PCB). Placing the readout device 800 and the sensor device 600 on separate substrates may facilitate efficient fabrication of both devices. The FETs 190 of the sensor device 600 may have channels formed from graphene or from semi-metal materials having no bandgap or a very small bandgap, and therefore may be difficult or impossible to completely "deactivate" or "turn off" (i.e., to reduce the drain-source current through the channel to zero amps or to a negligible level). However, one function of the readout device 800 is to turn on a selected row of FETs 190 while turning off all the other rows of FETs, thereby enabling the sensor device 600 to use M row selection interconnects to control the operation of an array of M*N FETs 190, and an additional N column readout interconnects to read the signals provided by the array of $2^N$ FETs 190. Thus, it is beneficial to fabricate the FETs of the readout device 800 using semiconductor materials, thereby allowing those FETs to be turned on and off. Fabricating the FETs of the readout device 800 and the FETs of the sensor device 600 on separate substrates facilitates the use of different fabrication process steps and materials to fabricate the different types of FETs. Alternatively, the readout device 800 and the sensor device 600 may be integrated on the same substrate. For example, the devices may be integrated using a hybrid fabrication process, in which the channel material for the FETs 190 of the sensor device 600 is graphene or a semi-metal, and the channel material for the circuits of the readout device 800 is a semiconductor.

Figure 9:
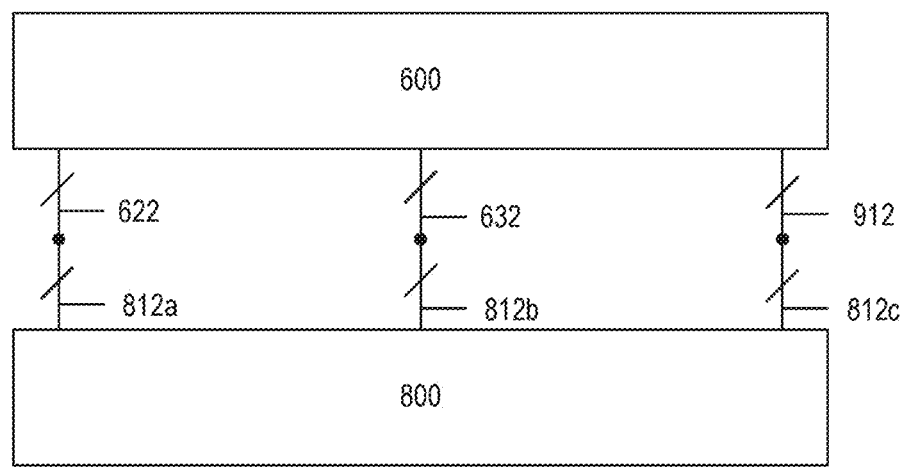
FIG. 9 is a block diagram of a sensor system in accordance with an embodiment of the invention.

Referring to FIG. 9, a sensor system 900 may include a sensor device 600 and a readout device 800. The row selection pins 622 of the sensor device 600 may be coupled to corresponding row selection pins 812a of the readout device 800. The column readout pins of the sensor device 600 may be coupled to corresponding column readout pins 812b of the readout device 800. Other pins 912 of the sensor device 600 (e.g., pins coupled to the bottom gate(s) 120 and/or the top gate electrode(s) 530) may be coupled to corresponding pins 812c of the readout device 800.

Applications and Implementations of Some Embodiments of the Invention

Figure 10:
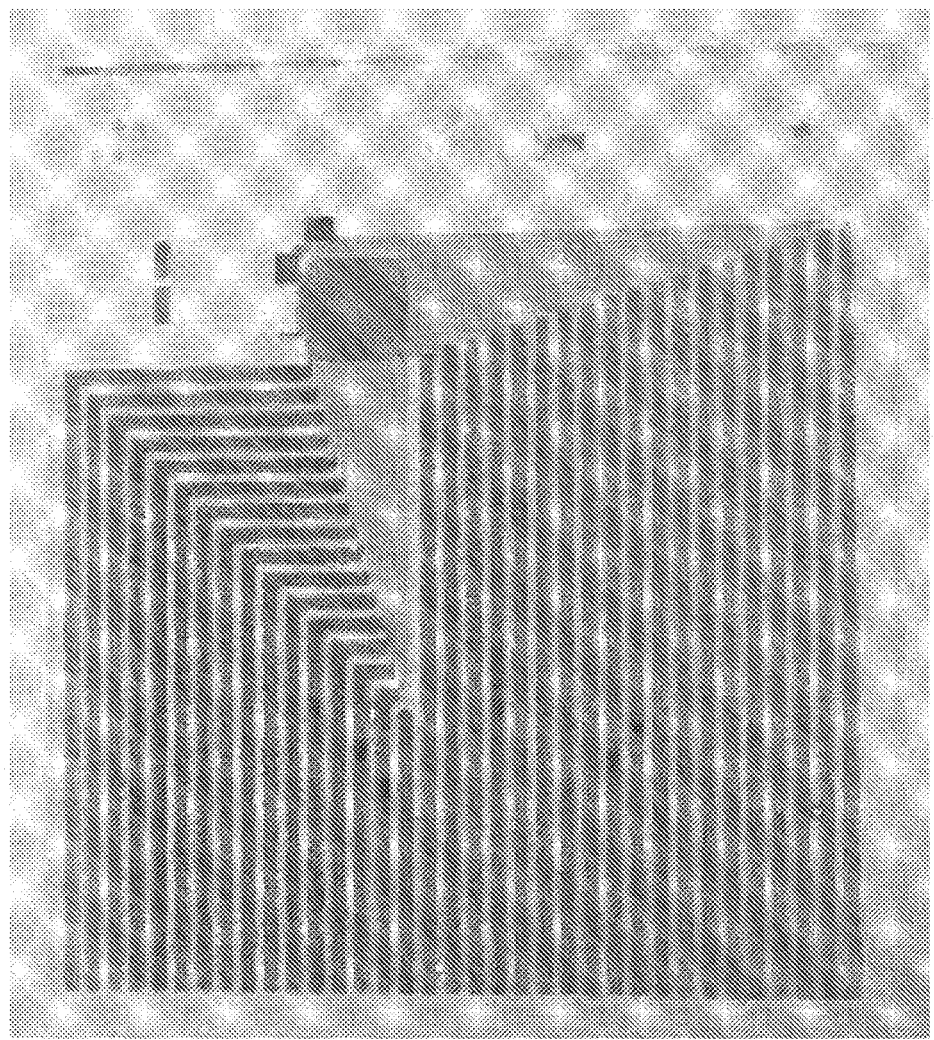
FIG. 10 is a photograph of a sensor array having non-transparent interconnects.

In one embodiment, a sensor device 600 is used to monitor chemical and/or electrical cellular activity. The sensor device may include a sensor array, and the sensor array architecture may be similar or identical to the array architecture depicted in FIG. 6. In this embodiment, the sensor device substrate is a transparent material such as a borosilicate glass coverslip. The conductive wires are fabricated using another transparent material such as indium tin oxide and using an interlayer dielectric material where appropriate. A transparent and electrically tunable material such as graphene is employed as the channel material of the field-effect transistor sensors. The wiring is covered with a transparent and chemically inert insulating material such as epoxy. Openings are made in the insulating material to provide the graphene channel regions access to the cell culture environment. Because the sensor device is manufactured using all transparent materials, some embodiments are compatible with compound microscopes and fluorescence imaging typically found in the life sciences. In addition, from a visual standpoint, the sensor device is virtually indistinguishable from a regular glass slide or coverslip. Because the sensor device incorporates a glass substrate, transparent conductors, interlayer dielectric, carbon, and epoxy, its manufacture is simple and economical. FIG. 10 shows an example of a sensor device with a 16×16 sensor array fabricated using non-transparent interconnects.

Figure 11A:
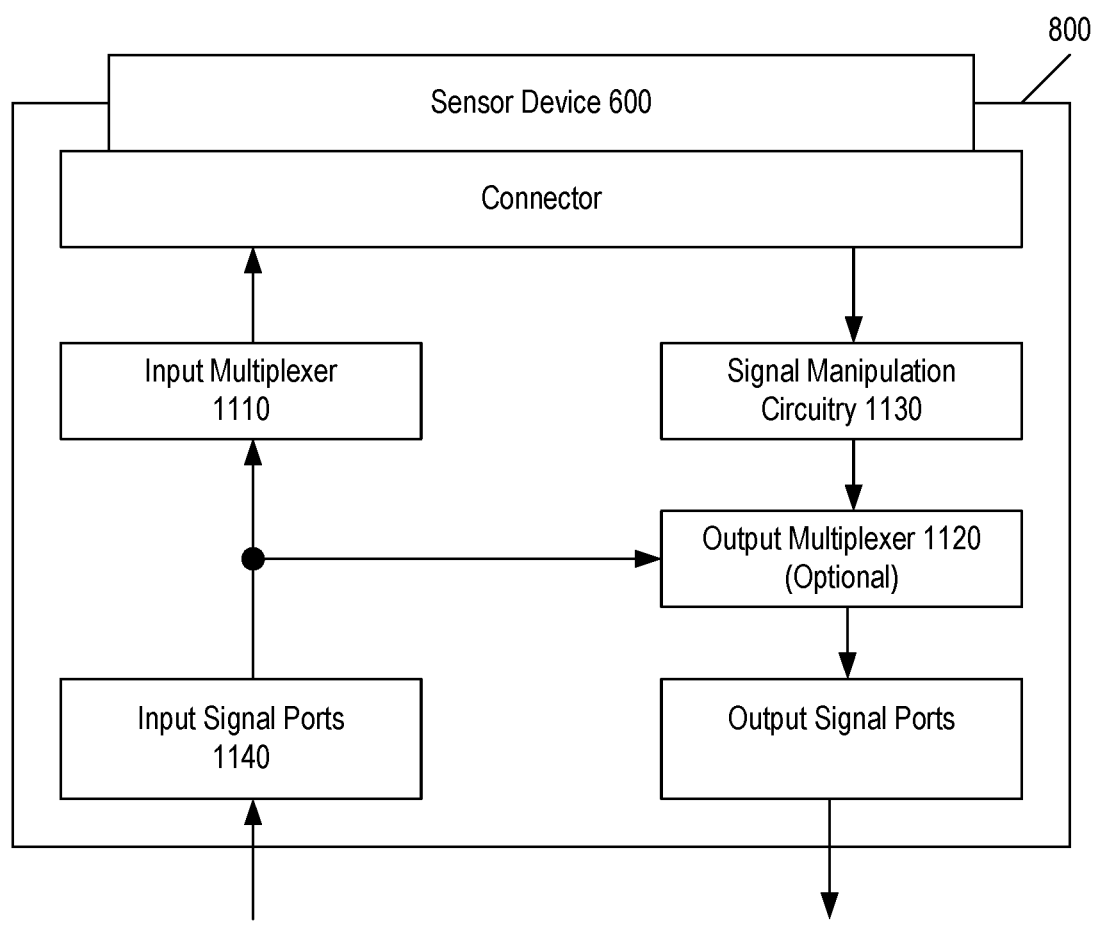
FIG. 11A is a block diagram of a readout device in accordance with an embodiment of the invention.
Figure 11B:
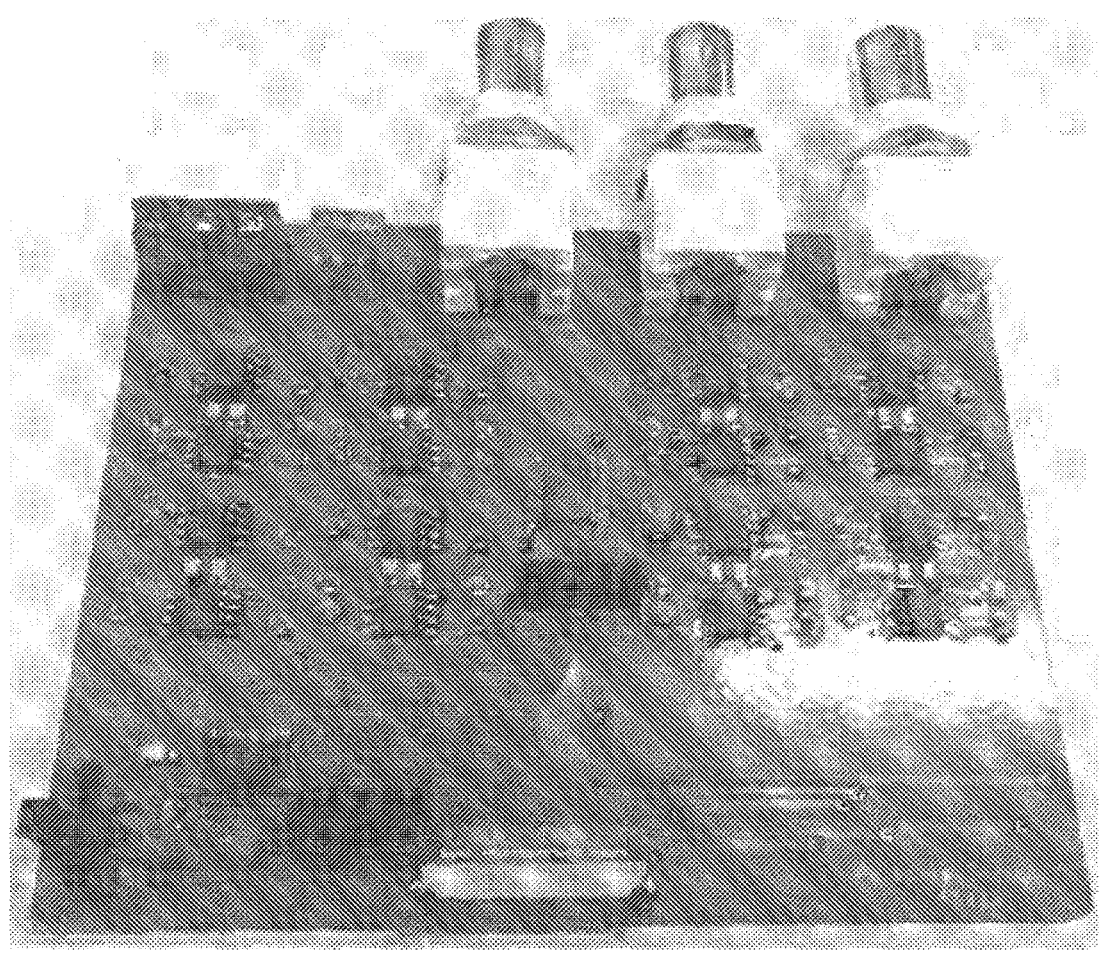
FIG. 11B is a photograph of a readout device in accordance with an embodiment of the invention.

The sensor device 600 may be inserted into or otherwise communicatively coupled to a readout device (e.g., a readout device 800 as described above and shown in FIG. 8, a custom printed circuit board containing sensor selection and signal manipulation circuitry, etc.). FIG. 11A shows a block diagram of an embodiment of a readout device 1100, and FIG. 11B shows a photograph of an embodiment of a readout device 1100. The readout device 110 may include an analog multiplexer 1110 for row selection and an optional analog multiplexer 1120 for column selection. The readout device 1100 also includes signal manipulation circuitry 1130 (e.g., amplifiers and filters) for cellular monitoring or other applications. The readout device 1100 includes input ports 1140 for the multiplexer control signals, which facilitates use of the readout device 1100 with data processing apparatus. The sensor device may be transparent, economical, and disposable, whereas the readout device may be a reusable component of the sensor system.

The readout device may perform sensor signal manipulation and manage the wire sharing taking place on the sensor device. In some embodiments, the readout device is controlled by a standard microcontroller development board. In some embodiments, the readout device is interfaced to a computer (e.g., a personal computer).

Graphene Electrolyte-Gated Field-Effect Transistors

In some embodiments, a reliable graphene EGFETs fabrication process is capable of producing 100% yield for a sample size of 256 devices. A graphene EGFET array architecture is described, along with a compact, inexpensive, and self-contained measurement system capable of performing DC characterization of 256 graphene EGFETs as a function of $V_{DS}$ and $V_{GS}$ within a matter of minutes, in some embodiments. This enables statistical analysis of graphene EGFET electrical performance for the first time. A compact piecewise DC model for graphene EGFETs is demonstrated that is capable of fitting 87% of $I_{DS}$ vs. $V_{GS}$ curves with a mean percent error of 7% or less. The model is used to extract variations in device parameters such as mobility, contact resistance, minimum carrier concentration, and Dirac point. Correlations in variations are presented. A framework for the application-specific optimization of large-scale graphene EGFET sensor designs is described.

Graphene is a two-dimensional carbon allotrope consisting of $sp^2$-bonded carbon atoms arranged in a planar hexagonal lattice. Graphene exhibits a number of desirable mechanical, optical, electrical, and chemical properties making it one of the most widely researched materials in recent years. A subset of these properties makes graphene potentially well suited for chemical and biological sensing applications. In terms of electrical properties, graphene boasts high carrier mobility, which is an important attribute for many chemical sensing applications. Graphene FETs have also demonstrated reasonable gain performance making them suitable amplifiers for electrogenic cell sensing applications. In terms of chemical properties, graphene is inert. This enables graphene sensors to directly interface with electrolytic environments and take advantage of the high electric double layer capacitance found in many chemical and biological sensing applications. In fact, graphene's inertness is also evidenced by the use of glassy carbon electrodes as a counter electrode in electrochemical measurements. Graphene has also been shown to exhibit a wide electrochemical potential window in phosphate buffered saline. In terms of optical properties, graphene exhibits little optical absorption in the visible spectrum making it suitable for use in transparent sensors for imaging purposes or otherwise. In terms of mechanical properties, graphene has been shown to possess excellent mechanical strength and flexibility making it potentially useful for flexible and smart skin sensing applications. Because graphene consists solely of atomically thin carbon, it is also not intrinsically expensive. Chemical vapor deposition growth processes enable large-scale and economical production.

The use of graphene as the channel material in electrolyte-gated field-effect transistors (EGFETs) has been studied. Some examples of applications of graphene-based EGFETs include chemical sensing, electrogenic cell sensing, and model development. Sample size and yield in conventional EGFET fabrication processes are generally very limited—often to tens of devices at best. In the event that previous works contain statistical information regarding electrical performance, they do not present information regarding the underlying device parameter variations that are responsible for variation in electrical performance. Some works provide insight via graphene variation using Raman spectroscopy, scanning tunneling microscopy, and THz time-domain spectroscopy. For applications making use of graphene EGFETs, however, variation data obtained from the measurement of actual graphene EGFETs is clearly the most relevant.

A sensor system is described herein with a chip architecture capable of accessing an array of M×N graphene EGFETs using only M+N wires. One specific implementation produces a sample size of 256 graphene EGFETs using a 16×16 array, which is accessed by 32 wires. This array enables statistical analysis of graphene EGFET electrical performance parameters such as drain-source current, transconductance, output conductance, and gain. A compact model for graphene EGFETs is also described herein, which enables extraction and statistical analysis of process-dependent graphene EGFET parameters such as mobility, minimum carrier concentration, contact resistance, and Dirac point.

A sensor system may include a personal computer (PC), microcontroller (μC), readout device (e.g., custom printed circuit board (PCB)), and sensor device (e.g., graphene EGFET array chip). In some embodiments, the graphene EGFET array chip and sensor system are compact, inexpensive, and self-contained (not requiring any additional equipment).

Figure 12:
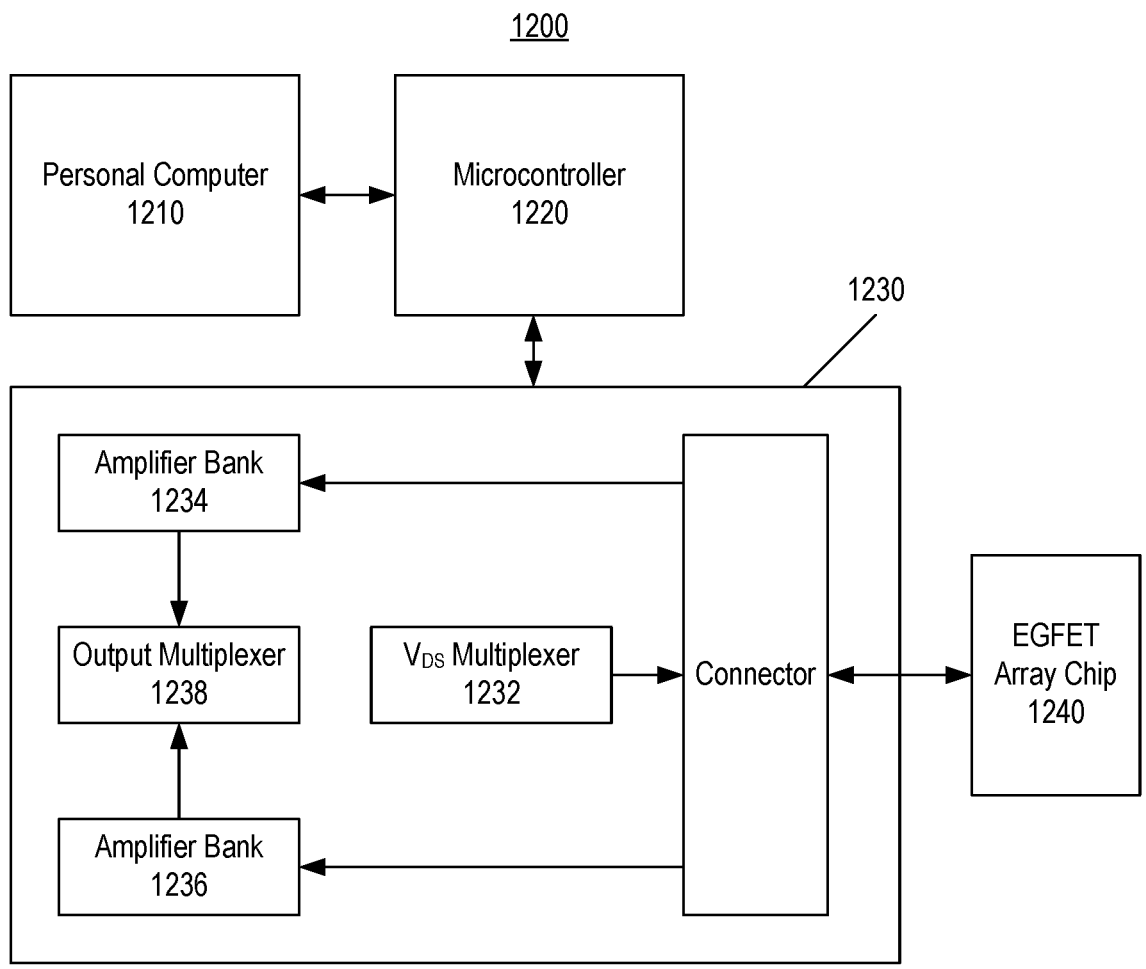
FIG. 12 is a block diagram of a sensor system in accordance with some embodiments of the invention.
Figure 13:
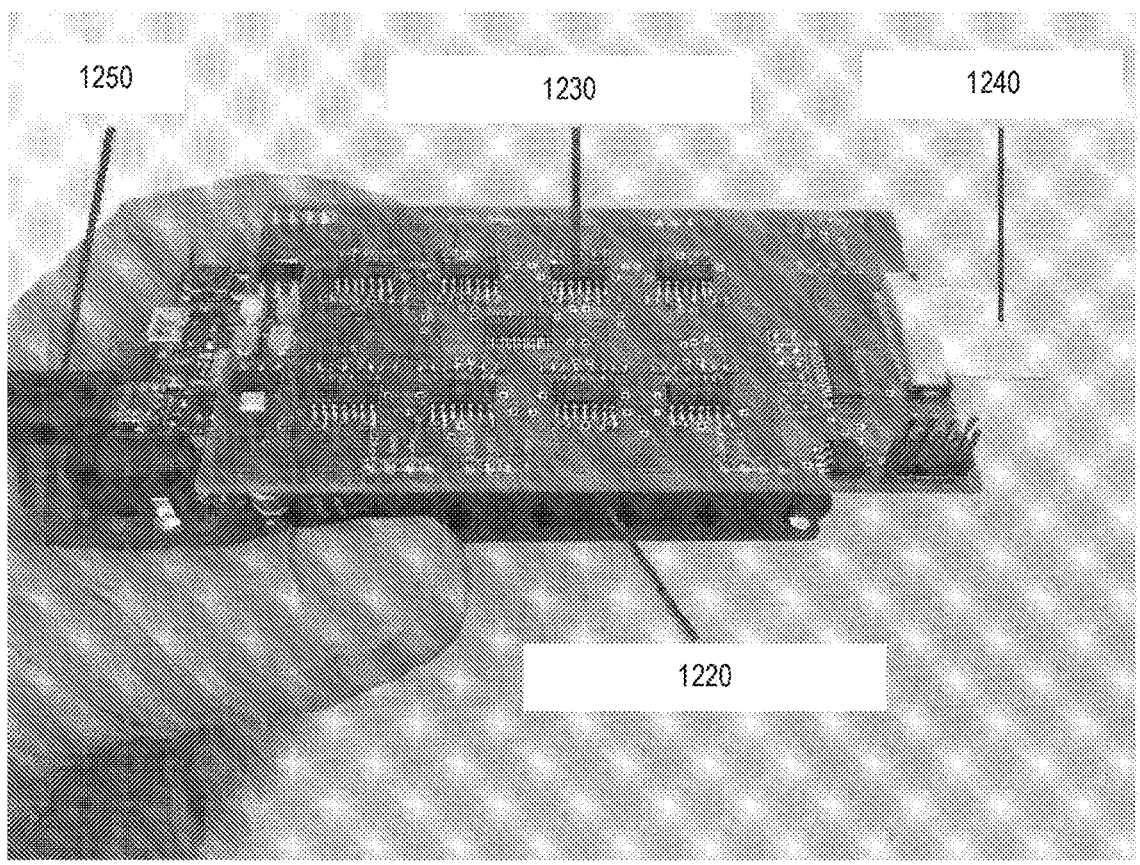
FIG. 13 is a photograph of a printed circuit board in accordance with some embodiments of the invention.

In particular, referring to FIGS. 12 and 13, in some embodiments, the sensor system 1200 includes a personal computer 1210, microcontroller 1220, readout device 800 (e.g., custom printed circuit board 1230), and sensor device 600 (e.g., graphene EGFET array chip 1240). The arrows in FIG. 12 indicate the direction of communication among the components of the sensor system 1200. The personal computer 1210 records and processes the measured data, and programs the microcontroller 1220. The microcontroller 1220 powers the PCB 1230 and supplies digital control signals to manage row and column selection on the graphene EGFET array chip 1240. The microcontroller 1220 is equipped with two 12-bit digital-to-analog (DAC) outputs that control the applied $V_{DS}$ and $V_{GS}$ biases. The custom PCB 1230 applies the $V_{DS}$ and $V_{GS}$ biases to the appropriate graphene EGFET within the array of the array chip 1240 and provides the amplified source-drain current $I_{DS}$ to the 12-bit analog-to-digital converter (ADC) on the microcontroller 1220. The acquired data is sent to the personal computer 1210 (e.g., via USB 1250). The sensor system 1200 is capable of characterizing $I_{DS}$ as a function of $V_{DS}$ and $V_{GS}$ for 256 graphene EGFETs within a matter of minutes, in some embodiments.

Figure 14:
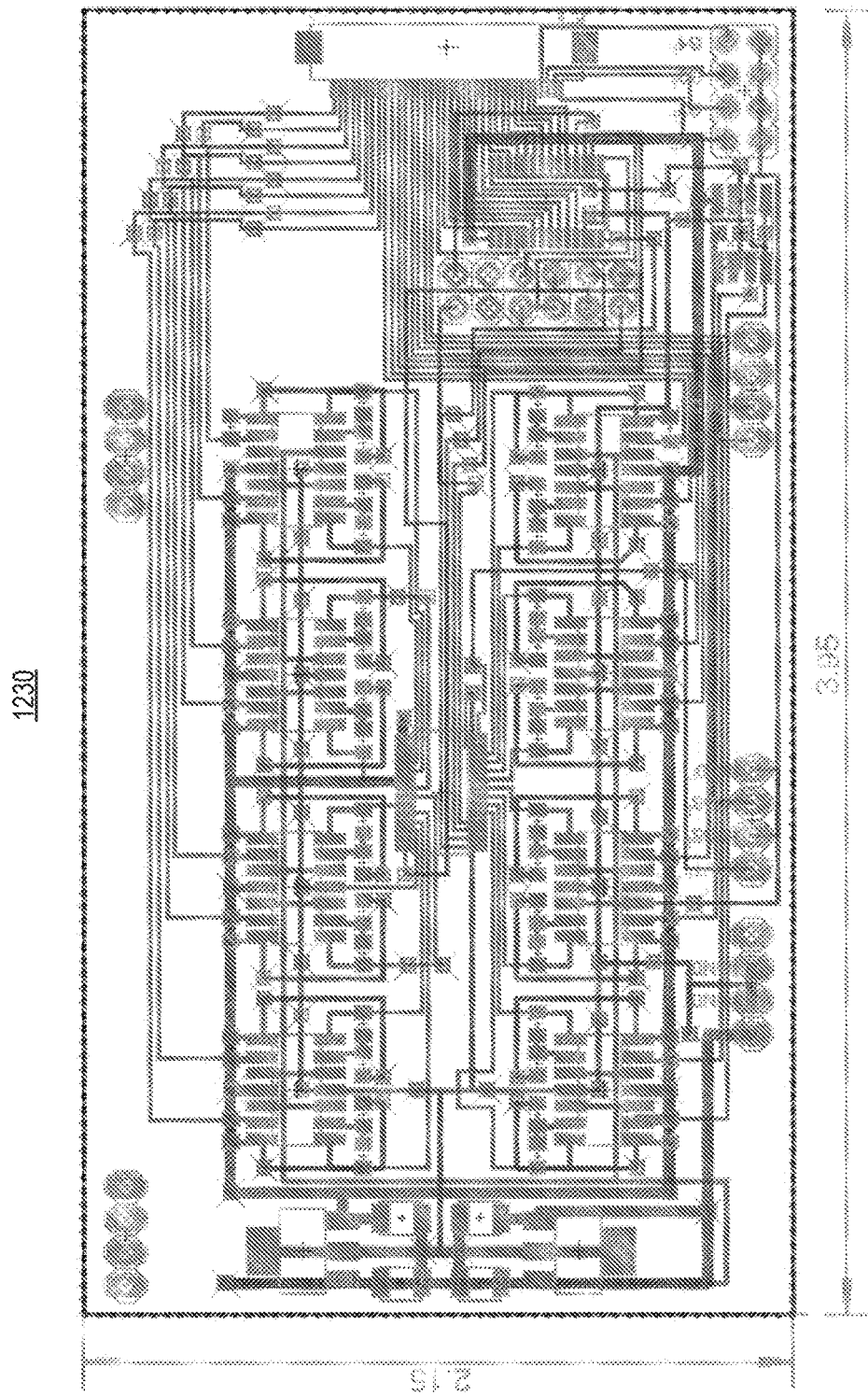
FIG. 14 is a schematic of a printed circuit board in accordance with some embodiments of the invention.
Figure 15:
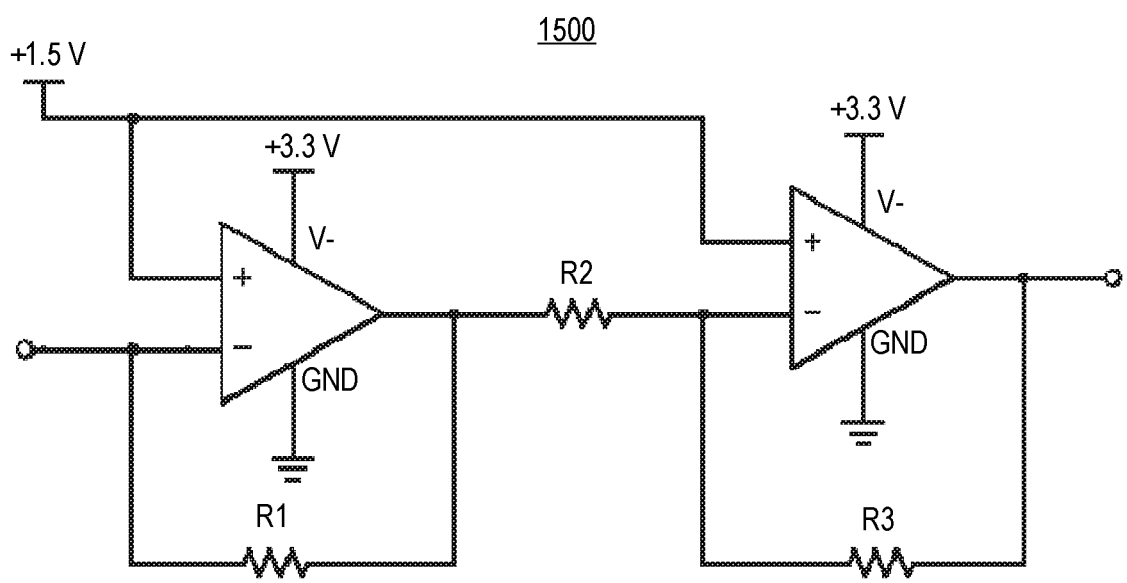
FIG. 15 is a schematic of a transimpedance amplifier.

The custom PCB 1230 can perform several functions. It can forward buffered $V_{DS}$ and $V_{GS}$ signals to the graphene EGFET array chip 1240. The PCB 1230 can apply the $V_{DS}$ bias to the appropriate row of the EGFET array via a 16-channel low impedance analog multiplexer 1232. The series resistance of each analog multiplexer channel may be approximately 2.5 Ohms. The PCB 1230 can amplify the resulting graphene EGFET $I_{DS}$ currents across the entire row using, for example, a two-stage low-noise transimpedance amplifier, which may include two banks 1234 and 1236. The gains of the first and second stages may be −1000 V/I and −10 V/V, respectively. Another 16-channel analog multiplexer 1238 may be used to perform column selection and forward the amplified $I_{DS}$ signal to a 12-bit analog-to-digital converter (ADC) on the microcontroller 1220. The PCB 1230 may contain a total of 34 operational amplifiers: 32 to perform $I_{DS}$ amplification and two for buffering $V_{DS}$ and $V_{GS}$ signals. A schematic of an embodiment of the PCB 1230 is shown in FIG. 14. A schematic of a transimpedance amplifier 1500 suitable for extracting graphene EGFET $I_{DS}$ currents provided by the EGFET array chip 1240 is shown in FIG. 15.

Figure 16:
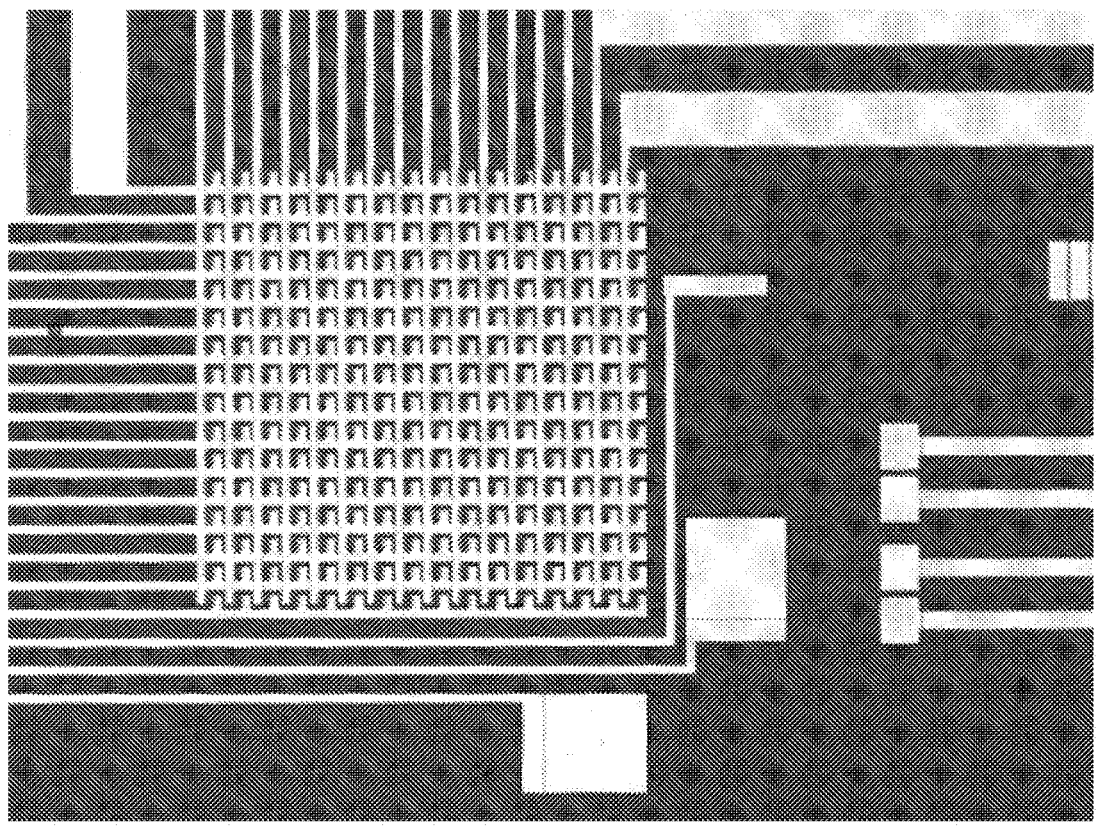
FIG. 16 is an optical microscope image of a graphene EGFET array chip in accordance with some embodiments of the invention.

In some embodiments, the array chip 1240 uses wire sharing to the extent possible while maintaining the ability to access individual sensor circuits. This allows access to M×N devices using only M+N wires. On the array chip, the output currents from all the sensor circuits in each column are coupled to a single, respective output. When only one sensor circuit per column is on at a given time, the entire output current for this column stems from that single sensor circuit. It is possible to ensure that only one sensor circuit per column is on using multiplexing. Individual columns may then be replicated row-wise because the $V_{DS}$ can be shared across columns simply by tying the drains and sources of the sensor circuits in the same row together in parallel. A schematic of a sensor device 600 embodying this wire-sharing scheme is illustrated in FIG. 6. FIG. 16 shows an optical microscope image of an array chip 1240 with a 16×16 graphene EGFET array.

In some embodiments, the fabrication process begins with a No. 2 coverslip with dimensions 2.2 cm×2.2 cm and thickness of approximately 0.2 mm. The coverslip is coated with 25 nm of $Al_2O_3$ using atomic layer deposition (ALD). This coating facilitates excellent photoresist adhesion in the subsequent metal liftoff process used to form Ti/Au (10 nm/150 nm) contact leads and array rows. Another 25 nm of $Al_2O_3$ is deposited as the interlayer dielectric. $BCl_3$ plasma is used to etch windows into the interlayer dielectric and allow contact between first and second metal layers where appropriate. The second Ti/Au (10 nm/150 nm) layer is deposited using electron beam evaporation and liftoff photolithography to form the array columns. Commercial graphene covered in poly methyl methacrylate (PMMA) from ACS Material is transferred over the array and $N_2$ dried to remove underlying water. The transferred graphene/PMMA film is then baked for 15 minutes at 80° C. and for two hours at 130° C. This step allows PMMA reflow, which helps ensure excellent adhesion between the graphene and substrate. The sample is immersed in acetone for several hours to remove the PMMA. The sample is then annealed for three hours at 350° C. in 700 sccm H₂ and 400 sccm Ar to further reduce PMMA surface residues and enhance adhesion between the graphene and substrate. The graphene channel regions are then defined using MMA/SPR3012 resist stacks and oxygen plasma etching. The sample is immersed in acetone for several hours to remove the resists. The sample is coated with approximately 2.4 μm of SU-8. Windows are defined in the SU-8 for the contact leads and over the graphene channel regions to allow electrolyte gating. The sample is baked at 150° C. for five minutes to remove SU-8 cracks and enhance chemical resistance. The sample is then coated with PMMA to protect the graphene from particulates and high-pressure water during the subsequent die saw process, which trims the coverslip to the appropriate size for the connector used in the measurement setup. The sample is then immersed in acetone for several hours to remove the protective PMMA layer.

Figure 17:
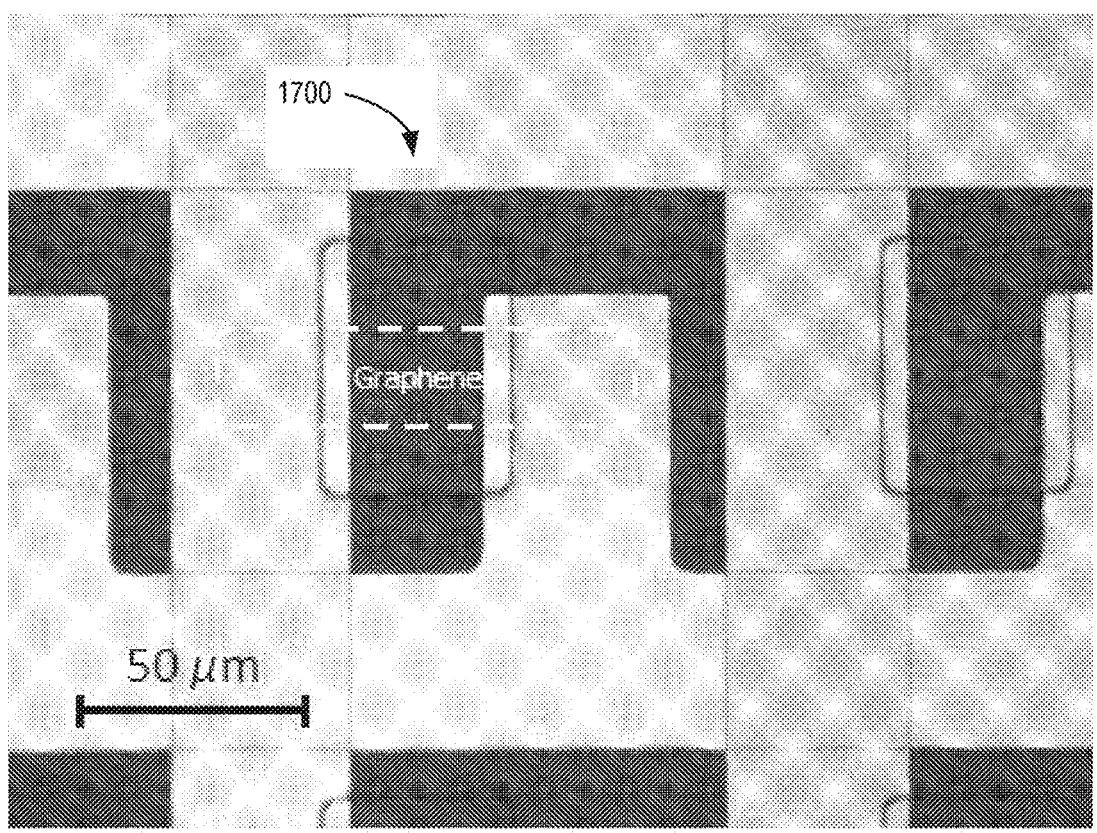
FIG. 17 is an optical microscope image of a graphene EGFET in accordance with an embodiment of the invention.
Figure 18:
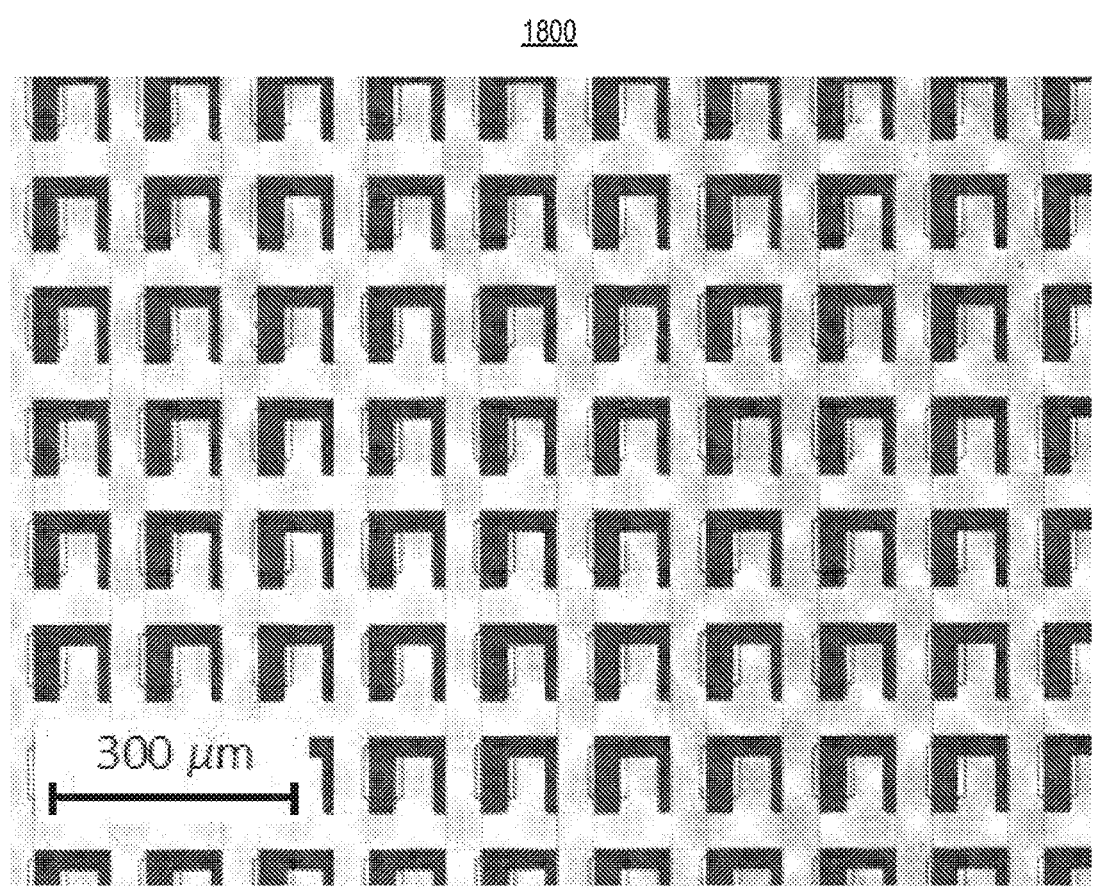
FIG. 18 is an optical microscope image of a portion of a 16×16 graphene EGFET array in accordance with some embodiments of the invention.

FIG. 17 shows an optical microscope image of a graphene EGFET 1700. FIG. 18 shows an optical microscope image of a portion of a 16×16 graphene EGFET array.

Using electrical data extracted from the graphene EGFET array, insight is obtained into (1) variations in source-drain current, transconductance, output conductance, and gain, and (2) variations in more fundamental device and material properties such as mobility, minimum carrier concentration, contact resistance, and Dirac point. Accessing this information enables a better understanding of the underlying physical origins producing the variations in electrical performance. With this understanding, a fabrication process is described herein. In some embodiments, the fabrication process is suitable for altering the variability in certain parameters and improving (e.g., optimizing) electrical performance for specific applications.

The graphene EGFET model described herein may be fast (i.e., computationally inexpensive). Fitting the model to a single experimental $I_{Ds}$ vs. $V_{GS}$ (drain-source current vs. gate-source voltage) dataset generally involves an iterative optimization over a 5-parameters space: mobility μ, top-gate capacitance $C_{TOP}$, contact resistance $R_C$, minimum carrier concentration $n_o$, and Dirac point $V_O$. This fitting process may then be repeated for each of the 256 experimental $I_{Ds}$ vs. $V_{GS}$ datasets. Each experimental $I_{DS}$ vs. $V_{GS}$ dataset spans roughly 1V in 10 mV increments. If an iterative process is used to calculate each individual $I_{DS}$ value, it produces a nested iterative fitting process multiplied by 256 datasets. This causes the overall fitting time to balloon making the fitting and parameter extraction process impractical. This motivates making reasonable simplifying assumptions to speed up $I_{DS}$ calculations as much as possible.

One model for graphene EGFETs incorporates the graphene quantum capacitance and solves for $I_{DS}$ by iteratively calculating the channel potential spatially until the channel potential profile and $I_{DS}$ are in agreement. This model assumes symmetric contact resistances along with constant and equivalent electron and hole mobilities. This iterative process has been shown to accurately model the DC characteristics of graphene EGFETs but is computationally expensive. In this section, the computationally expensive model is used as a starting point and reasonable simplifying assumptions are made to derive a compact model.

$$I_{DS} \approx \frac{\mu \frac{W}{L} \int_{I_{DS}R_C}^{V_{DS}-I_{DS}R_C} \sqrt{(qn_o)^2 + [C_{TOP}(V)[V_{GS} - V - V_o]]^2}\, dV}{1 + \left|\frac{\mu[V_{DS} - 2I_{DS}R_C]}{Lv_{sat}}\right|} \quad \text{Eq. 1)}$$

In Eq. 1, W is the channel width, L is the channel length, $v_{sat}$ is the saturation velocity, and q is the elementary charge. For large sample sizes, a compact model is advantageous. This compactness is achieved by making a few reasonable simplifying assumptions. Saturation velocity can be neglected because graphene EGFETs are generally biased at low voltages to avoid undesirable oxidation/reduction reactions. This produces Eq. 2.

$$I_{DS} \approx \mu \frac{W}{L} \int_{I_{DS}R_C}^{V_{DS}-I_{DS}R_C} \sqrt{(qn_o)^2 + [C_{TOP}(V)[V_{GS} - V - V_o]]^2}\, dV \quad \text{Eq. 2)}$$

The top-gate capacitance remains a function of potential along the graphene channel because of the graphene quantum capacitance's voltage dependence. To further simplify the model, the graphene quantum capacitance is neglected rendering the top-gate capacitance a constant. This produces Eq. 3.

$$I_{DS} \approx \mu \frac{W}{L} \int_{I_{DS}R_C}^{V_{DS}-I_{DS}R_C} \sqrt{(qn_o)^2 + [C_{TOP}(V_{GS} - V - V_o)]^2}\, dV \quad \text{Eq. 3)}$$

This equation may now be integrated, but still produces a transcendental equation where $I_{DS}$ appears on both sides of the equation. Therefore, $I_{DS}$ is still solved numerically using an iterative approach, which drastically slows down the fitting process since the iterative process is performed to calculate each and every individual $I_{DS}$ point throughout the entire fitting process.

This model may be significantly simplified without introducing a large degree of error by making another simplifying assumption in conjunction with a piecewise approach to solving Eq. 3. The form of the original integrand produces a nice rounding near the minimum carrier concentration and provides continuity in the first derivative. However, because $I_{DS}$ is proportional to the area under the entire curve, a compact piecewise solution can be derived by assuming an abrupt transition near the minimum carrier concentration. This results in the following piecewise integral equation given by Eq. 4.

For $V_{GS} - V_o \leq I_{DS}R_C I_{DS}$, Eq. 4)

$$I_{DS} \approx \mu \frac{W}{L} \int_{I_{DS}R_S}^{V_{DS}-I_{DS}R_C} qn_o + C_{TOP}(-V_{GS} + V + V_o)dV, \text{ for}$$

$I_{DS}R_C < V_{GS} - V_o < V_{DS} - I_{DS}R_C,$ $$I_{DS} \approx \mu \frac{W}{L} \int_{I_{DS}R_C}^{V_{GS}-V_o} qn_o + C_{TOP}(V_{GS} - V - V_o)dV +$$

$$\int_{V_{GS}-V_o}^{V_{DS}-I_{DS}R_C} qn_o + C_{TOP}(V_{GS} - V - V_o)dV \text{ and for}$$

$V_{GS} - V_o \geq V_{DS} - I_{DS}R_C,$

-continued $$I_{DS} \approx \mu \frac{W}{L} \int_{I_{DS}R_C}^{V_{DS}-I_{DS}R_C} qn_o + C_{TOP}(V_{GS} - V - V_o)dV.$$

All integrals within Eq. 4 are readily integrated. Although $I_{DS}$ also appears in the bounds of the integrals on the right-hand-side of the equation, with a little manipulation, $I_{DS}$ can in fact be isolated to the left-hand-side to produce the following compact piecewise DC graphene EGFET model. It is important to note that this model is also applicable to metal-oxide gated graphene FETs.

For $V_{GS} - V_o \leq I_{DS}R_C$, $I_{DS} \approx \dfrac{\mu\frac{W}{L}V_{DS}\left[C_{TOP}\left(\frac{V_{DS}}{2} - V_{GS} + V_o\right) + qn_o\right]}{1 + 2\mu\frac{W}{L}R_C\left[C_{TOP}\left(\frac{V_{DS}}{2} - V_{GS} + V_o\right) + qn_o\right]}$, for Eq. 5)

$I_{DS}R_C < V_{GS} - V_o < V_{DS} - I_{DS}R_C$, $I_{DS} \approx \dfrac{1 + \mu\frac{W}{L}R_C(C_{TOP}V_{DS} + 2qn_o) - \sqrt{\left[1 + \mu\frac{W}{L}R_C(C_{TOP}V_{DS} + 2qn_o)\right]^2 - 4\mu\frac{W}{L}C_{TOP}R_C^2\left[\mu\frac{W}{L}\left[\frac{1}{2}C_{TOP}[V_{DS}^2 + 2(V_{GS} - V_o)^2 - 2V_{DS}(V_{GS} - V_o)] + qn_oV_{DS}\right]\right]}}{2\mu\frac{W}{L}C_{TOP}R_C^2}$, and for $V_{GS} - V_o \geq V_{DS} - I_{DS}R_C$, $I_{DS} \approx \dfrac{\mu\frac{W}{L}V_{DS}\left[C_{TOP}\left(V_{GS} - V_o - \frac{V_{DS}}{2}\right) + qn_o\right]}{1 + 2\mu\frac{W}{L}R_C\left[C_{TOP}\left(V_{GS} - V_o - \frac{V_{DS}}{2}\right) + qn_o\right]}$.

Figure 19:
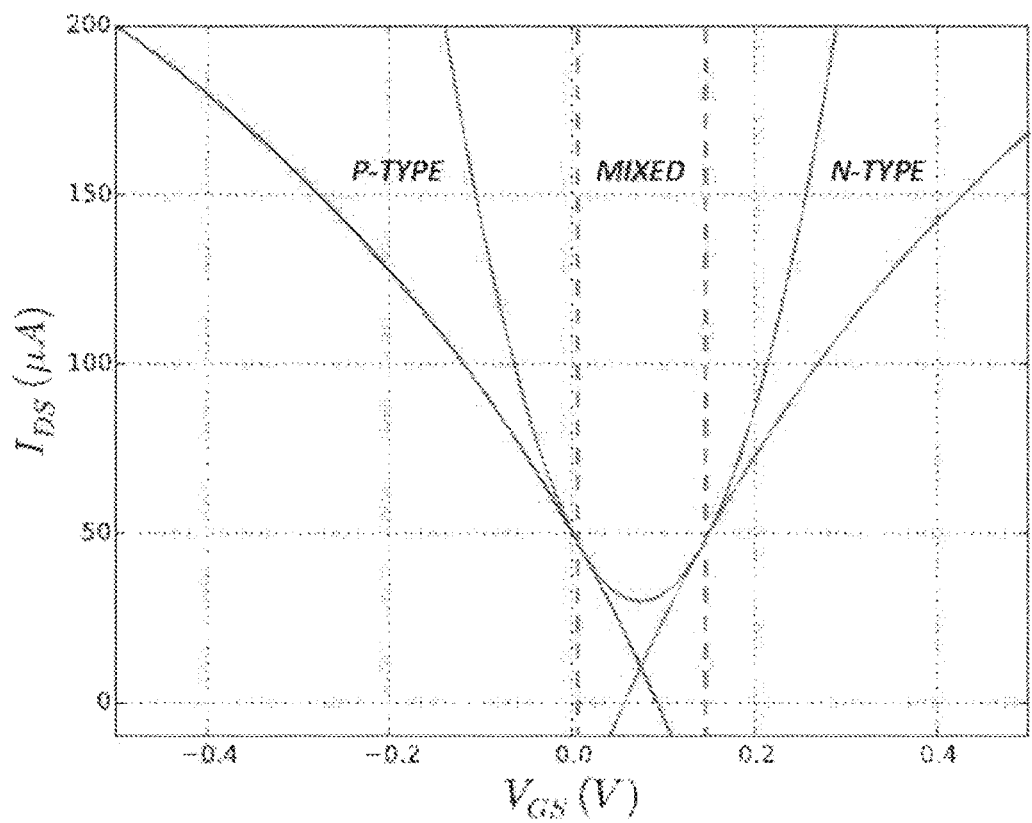
FIG. 19 shows a piecewise model of an EGFET.
Figure 20:
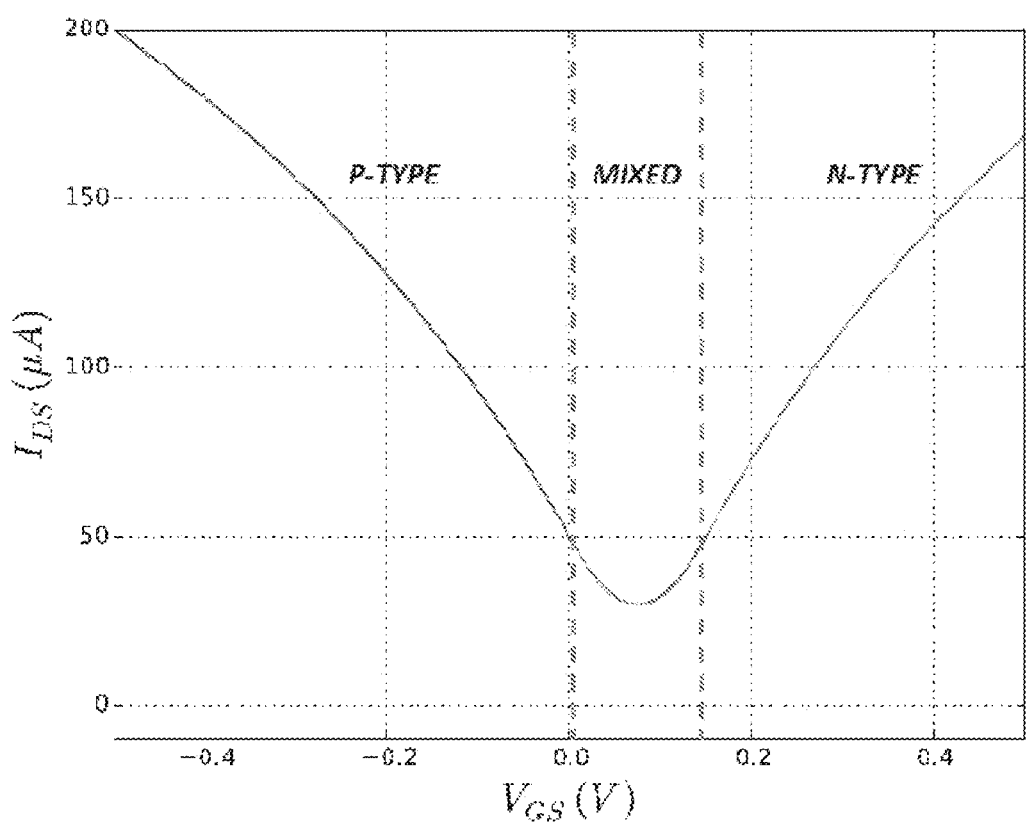
FIG. 20 shows different domains of the piecewise model of FIG. 19 stitched together to yield an overall graphene EGFET model.

Eq. 5 may look daunting but is in fact easily coded and enables direct evaluation of the source-drain current $I_{DS}$. This in turn enables the rapid $I_{DS}$ vs. $V_{GS}$ curve generation required for the fitting process. FIGS. 19 and 20 illustrate how the different segments of the piecewise model are stitched together to yield familiar looking graphene EGFET $I_{DS}$ vs. $V_{GS}$ curves. In particular, FIG. 19 shows the different segments of the piecewise model and their smooth and continuous intersections, and FIG. 20 shows different domains of the piecewise model stitched together to yield the overall graphene EGFET $I_{DS}$ vs. $V_{GS}$ curve. The input parameters for the example shown in FIGS. 19 and 20 are $V_{DS}$=150 mV, μ=450 cm²/Vs, $C_{Top}$=9.0 uF/cm², $R_C$=5 kΩ·um, $n_o$=1×10¹²/cm², $V_O$=0.0 V.

Before performing any optimization, it is desirable to develop some understanding of how the input variables may affect the objective function. This is especially true for physical problems such as graphene EGFET performance optimization. As described above, a graphene EGFET array with each EGFET in a common source amplifier configuration may be used to monitor electrogenic cells such as neurons or cardiac cells. The process of optimizing the gain of a graphene EGFET in the common source amplifier configuration is described.

Trends in gain performance based on changing design parameters ($V_{DS}$, $V_{GS}$, W, L) and process-dependent parameters (μ, $C_{TOP}$, $R_C$, $n_o$, $V_O$) are as follows. To facilitate visualization of the data, only two input parameters are varied at a time while each of the remaining parameters remains fixed at a baseline value. The baseline values are given in Table I.

TABLE I

Baseline Input Parameters

| Parameter | | | | | | | | |
|---|---|---|---|---|---|---|---|---|
| | $V_{DS}$ | $V_{GS}$ | W | L | μ cm²/Vs | $C_{TOP}$ μF/cm² | $R_C$ kΩW | $n_o$ /cm² | $V_O$ mV |
| Units | mV | mV | μm | Mm | | | | | |
| Value | 200 | N/A | 30 | 30 | 475 | 3.0 | 6.5 | 1.1 × 10¹² | −35 |

Experimental results show that the optimal $V_{GS}$ does not vary significantly with changing channel length. The results also show that the gain is virtually independent of channel width provided that all other parameters remain constant. This is likely because increasing the width increases the transconductance and output conductance by the same amount leaving the overall gain unaffected. The results also show that the gain falls off as we the channel length is reduced. This is likely because at shorter channel lengths, the contact resistance has a more pronounced effect on the transconductance while keeping the output conductance relatively constant because it is dominated by the graphene.

The results show that gain increases with $V_{DS}$. Therefore, if the application requires higher gain, one can simply increase the $V_{DS}$ bias. Gain has an asymptotic fall off behavior for shorter channel lengths. The results also show that increasing $V_{DS}$ increases $I_{DS}$, and current noise is known to be proportional to $I_{DS}$. The relationship between SNR, gain, and $I_{DS}$ is derived in Eqns. 6-8. The results show that there does exist a tradeoff: higher $V_{DS}$ biases enhance gain but diminish SNR.

$$i_n \propto I_{DS}^2 \qquad \text{Eq. 6)}$$

$$v_n \propto RI_{DS}^2 \qquad \text{Eq. 7)}$$

$$SNR = \frac{V_o}{v_n} = \frac{G_v v_{in}}{v_n} \propto \frac{G_v v_{in}}{RI_{DS}^2} \propto \frac{G_v}{RI_{DS}^2} \propto \frac{G_v}{I_{DS}^2} \qquad \text{Eq. 8)}$$

where $V_o$ is the output signal, $v_n$ is the voltage noise, $G_v$ is the voltage gain, and R is the device resistance.

The effects of the design parameters on the gain has been described. The effects of the process-dependent parameters on the gain are discussed below. As the name indicates, these parameters are largely process dependent and therefore generally more difficult to control. If they produce very promising results, the fabrication process can be modified to achieve better gain performance.

The results show that increasing mobility actually reduces the gain given all other parameters are held constant, presumably because it increases output conductance to a greater extent than transconductance. This effect becomes more pronounced as the channel length is reduced. Another interpretation is that high mobility increases the importance of having low contact resistance. In any event, increasing mobility by a reasonable few hundred cm$^2$/Vs actually does not greatly diminish gain except at very short channel lengths where contact resistance plays a greater role.

Experimental results show that increasing top-gate capacitance increases the gain. This is because devices with higher top-gate capacitance more effectively translate $V_{GS}$ signals into the channel. Essentially, increasing the top-gate capacitance increases the graphene EGFET's sensitivity to perturbations in $V_{GS}$. In practice, the top-gate capacitance is limited by the graphene quantum capacitance and graphene's hydrophobicity, which limit the achievable top-gate capacitance. Nonetheless, it is preferable to perform measurements in electrolytes that maximize the top-gate capacitance to the extent possible.

The results show that lower contact resistances produce higher gain if all other parameters are fixed, because lower contact resistance results in a higher transconductance while having little effect on the output conductance, which is mostly determined by the graphene channel. This effect becomes more pronounced at small channel lengths where contact resistance has a greater effect on performance. Because contact resistance is a parasitic and generally provides no benefit, it should generally be minimized.

The results show that decreasing $n_o$ increases gain. Decreasing $n_o$ likely has little effect on the transconductance. It does, however, lower the output conductance, especially in the region around the minimum conduction point on the $I_{DS}$ vs. $V_{GS}$ curve. This is the region where the maximum gain is generally found. Ultimately, decreasing $n_o$ decreases $g_o$ while keeping $g_m$ relatively constant, which increases the gain.

The results show that changing $V_O$ has no effect on the gain. Recall that gain is defined as the maximum gain produced by some optimal $V_{GS}$ bias. Changing $V_O$ simply changes the location of the optimal $V_{GS}$ bias, but it has no effect on the actual magnitude of the gain.

The general trends for optimizing gain are summarized in Table II.

TABLE II

Summary of Parameter Trends Optimizing Gain

| Parameter | $V_{DS}$ | $V_{GS}$ | W | L | μ | $C_{TOP}$ | $R_C$ | $n_o$ | $V_O$ |
|---|---|---|---|---|---|---|---|---|---|
| Desired | ↑ | N/A | ↕ | ↑ | ↓* | ↑ | ↓ | ↓ | ↕ |

Using the above-described information regarding gain performance, it is possible to move on to a more thorough and complex procedure for application-specific performance optimization. Instead of optimizing purely for gain, it is possible to include penalties for variability in gain, increases in device area, noise, and power consumption. Minimizing variability in gain performance can be especially important for applications where all devices are gated using a common $V_{GS}$. An objective function including these various penalty terms is given by Eq. 9. The design and process parameters are omitted here for readability. Eq. 9 also assumes the scenario in which the designer is free to manipulate the design parameters but has no control over the process parameters.

$$F(V_{DS}, V_{GS}, W, L) = \mu(\text{Gain}) + k_1 \sigma(\text{Gain}) + k_2 WL + k_3 I_{DS} \qquad \text{Eq. 9)}$$

The constants $k_1$, $k_2$, and $k_3$ are negative values because increases in variation, area, noise, and power consumption are typically undesirable. Optimization algorithms are generally designed to minimize a loss function. This is achieved simply by taking the negative logarithm of the Eq. 9 to produce Eq. 10.

$$H(V_{DS}, V_{GS}, W, L) = -\ln\,[\mu(\text{Gain}) + k_1 \sigma(\text{Gain}) + k_2 WL + k_3 I_{DS}] \qquad \text{Eq. 10)}$$

It is important to note that the standard deviation in gain performance can be approximated using a multivariate normal distribution in conjunction with parameter variation data. The multivariate normal distribution is given by Eq. 11. The process parameter means for μ, $R_C$, $n_o$, $V_O$ are stored in a vector μ and Σ is the covariance matrix for these parameters.

$$\mathcal{N}(\mu, \Sigma) = \frac{1}{\sqrt{(2\pi)^n |\Sigma|}} \exp\left(-\frac{1}{2}(x-\mu)^T \Sigma^{-1} (x-\mu)\right) \qquad \text{Eq. 11)}$$

Using Eq. 11, the performance of the graphene EGFET array for the specific application of electrogenic cell sensing can be improved (e.g., optimized) by setting $k_1$, $k_2$, and $k_3$ and minimizing the loss function using an optimization algorithm capable of handling non-convex problems.

A reliable fabrication process for graphene EGFETs capable of producing 100% yield for a large sample size of 256 devices has been described. A compact and self-contained measurement system capable of performing DC characterization of 256 graphene EGFETs as a function of $V_{DS}$ and $V_{GS}$ within minutes has been described. A suitable graphene EGFET array chip architecture has also been described.

A compact piecewise graphene EGFET model capable of fitting 87% of graphene EGFET $I_{DS}$ vs. $V_{GS}$ curves with a mean percent error of 7% or less has been described. This model then enables the extraction of device parameters such as mobility, contact resistance, minimum carrier concentration, and Dirac point and also provides insight into the correlation between these parameter variations. The impacts of design parameters and process-dependent parameters on graphene EGFET gain performance have been described. A framework for application-specific graphene EGFET performance optimization involving numerous design constraints has been described.

Terminology

The phraseology and terminology used herein is for the purpose of description and should not be regarded as limiting.

The term "approximately", the phrase "approximately equal to", and other similar phrases (e.g., "substantially"), as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

EQUIVALENTS

It is contemplated that apparatus, systems, and methods embodying the subject matter described herein encompass variations and adaptations developed using information from the examples described herein. Adaptation and/or modification of the apparatus, systems, and methods described herein may be performed by those of ordinary skill in the relevant art.

Throughout the description, where apparatus and systems are described as having, including, or comprising specific components, or where processes and methods are described as having, including, or comprising specific steps, it is contemplated that, additionally, there are apparatus and systems of the present invention that consist essentially of, or consist of, the recited components, and that there are processes and methods according to the present invention that consist essentially of, or consist of, the recited processing steps.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A sensor system comprising:
a sensor device, including:
- a substrate selected from the group consisting of a transparent substrate and a flexible polymer substrate; and
- a transparent sensor array disposed on the substrate, the transparent sensor array including a plurality of transparent sensor circuits and a plurality of transparent interconnects electrically coupled to the plurality of transparent sensor circuits, wherein each of the transparent sensor circuits includes a respective transparent transistor having (i) a transparent drain electrically coupled to at least one of the transparent interconnects, (ii) a transparent source electrically coupled to at least one of the transparent interconnects, and (iii) a transparent channel region electrically coupled to the source and the drain, and wherein the transparent sensor array includes:
- M*N of the transparent sensor circuits arranged in M rows and N columns; and
- the plurality of transparent interconnects including M row selection interconnects and N column readout interconnects,
- wherein (i) each of the row selection interconnects corresponds to a respective row of N transparent sensor circuits and is coupled to the drains of the N transparent sensor circuits in the respective row, and (ii) each of the column readout interconnects corresponds to a respective column of M transparent sensor circuits and is coupled to the sources of the M transparent sensor circuits in the respective column.

2. The sensor system of claim 1, further comprising:
a readout device including:
- a row selection circuit comprising M row selection switches configured to communicatively couple, respectively, to the M row selection interconnects of the sensor device; and
- an amplifier circuit comprising N amplifiers configured to communicatively couple, respectively, to the N column readout interconnects of the sensor device, wherein the readout device is not integrated on the substrate of the sensor device.

3. A sensor system comprising:
a sensor device, including:
- a transparent substrate comprising borosilicate glass; and
- a transparent sensor array disposed on the substrate, the transparent sensor array including a plurality of transparent sensor circuits and a plurality of transparent interconnects electrically coupled to the plurality of transparent sensor circuits, wherein each of the transparent sensor circuits includes a respective transparent transistor having (i) a transparent drain electrically coupled to at least one of the transparent interconnects, (ii) a transparent source electrically coupled to at least one of the transparent interconnects, and (iii) a transparent channel region electrically coupled to the source and the drain, and wherein at least one of the transparent interconnects is coupled to a plurality of the transparent drains or to a plurality of the transparent sources.

4. A method comprising:
- preparing a transparent slide for observation of a specimen by placing the specimen in fluidic communication with a transparent sensor circuit;
- detecting an electrical signal from the transparent sensor circuit; and
- determining at least one attribute of the specimen based at least in part on the electrical signal, wherein the transparent slide comprises the transparent sensor circuit disposed on a transparent substrate, and wherein the determined attribute of the specimen is selected from a group consisting of a nutrient level of a cell culture medium and a pH of the cell culture medium.

5. A method comprising:
- placing a sensor device on a surface of an object, wherein (i) the sensor device includes a sensor array disposed on a flexible polymer substrate, (ii) the sensor array includes a plurality of transparent sensor circuits, (iii) a surface of the flexible polymer substrate is in contact with and conforms to at least a portion of the surface of the object, and (iv) each of the transparent sensor circuits is disposed at a respective location adjacent to the surface of the object;
- detecting electrical signals from the transparent sensor circuits; and
- determining parameters at the respective locations adjacent to the surface of the object based on the electrical signals.

6. The method of claim 5, wherein the portion of the surface of the object is non-planar.

7. The method of claim 5, wherein the sensor device further comprises a plurality of interconnects electrically coupled to the plurality of transparent sensor circuits, and wherein each of the transparent sensor circuits includes a respective transparent transistor having (i) a transparent drain electrically coupled to at least one of the interconnects, (ii) a transparent source electrically coupled to at least one of the interconnects, and (iii) a transparent channel region electrically coupled to the source and the drain.

8. The method of claim 5, wherein the sensor array is transparent.

9. The method of claim 5, wherein the parameters are selected from the group consisting of temperatures and electrolyte levels.

* * * * *